(12) United States Patent
Kunugimoto et al.

(10) Patent No.: US 12,174,549 B2
(45) Date of Patent: Dec. 24, 2024

(54) LIQUID AMOUNT MEASURING METHOD AND COMPUTER-READABLE RECORDING MEDIUM

(71) Applicant: Tokyo Electron Limited, Tokyo (JP)

(72) Inventors: Yuichiro Kunugimoto, Koshi (JP); Shota Ueyama, Koshi (JP); Akihiro Teramoto, Koshi (JP); Yuta Nishiyama, Koshi (JP); Shinichi Hatakeyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/213,785

(22) Filed: Jun. 23, 2023

(65) Prior Publication Data

US 2023/0418166 A1 Dec. 28, 2023

Related U.S. Application Data

(62) Division of application No. 17/522,050, filed on Nov. 9, 2021, now Pat. No. 11,726,409.

(30) Foreign Application Priority Data

Nov. 16, 2020 (JP) ................................. 2020-190281

(51) Int. Cl.
*G01F 9/00* (2006.01)
*B08B 3/02* (2006.01)
(Continued)

(52) U.S. Cl.
CPC ............ *G03F 7/70491* (2013.01); *B08B 3/02* (2013.01); *B08B 13/00* (2013.01); *G01F 9/003* (2013.01); *G01G 21/22* (2013.01); *G03F 7/16* (2013.01)

(58) Field of Classification Search
CPC ........ G03F 7/70491; G03F 7/16; G03F 7/162; G03F 7/30; B08B 3/02; B08B 13/00;
(Continued)

(56) References Cited

U.S. PATENT DOCUMENTS 7,187,994 B1 3/2007 Ashkenaz et al.

FOREIGN PATENT DOCUMENTS

JP 3198455 U 6/2015
JP 6087765 B2 * 3/2017 ....... H01L 21/67051
JP 2018-098414 A 6/2018

OTHER PUBLICATIONS

Machine translation of JP-6087765-B2 (Year: 2017).*
Machine translation of JP-2018098414 (Year: 2018).*

* cited by examiner

*Primary Examiner* — Erin F Bergner
(74) *Attorney, Agent, or Firm* — Nath, Goldberg & Meyer; Jerald L. Meyer; Tanya E. Harkins

(57) ABSTRACT

A substrate processing system includes: a measuring unit provided detachably with respect to a placement portion of a placement stage; a measuring jig for measuring a processing liquid; a liquid processing unit including a supplier which supplies the processing liquid to the measuring jig; a transfer mechanism for transferring the measuring jig between the measuring unit and the liquid processing unit; and a controller. The controller executes: a process of transferring the measuring jig in the measuring unit from the measuring unit to the liquid processing unit; a process of ejecting the processing liquid from the supplier to the measuring jig; a third process of transferring the measuring jig from the liquid processing unit to the measuring unit; and a fourth process of calculating an ejection amount of the processing liquid based on a measurement value in the measuring unit.

5 Claims, 19 Drawing Sheets

(51) Int. Cl.
*B08B 13/00* (2006.01)
*G01G 21/22* (2006.01)
*G03F 7/00* (2006.01)
*G03F 7/16* (2006.01)

(58) Field of Classification Search
CPC ........ G01F 9/003; G01G 21/22; G01G 17/04; G01G 23/14; B05D 1/00; H01L 21/67051; H01L 21/6715; H01L 21/67253; H01L 21/02057; H01L 21/0274; H01L 21/67742; H01L 21/67775
See application file for complete search history.

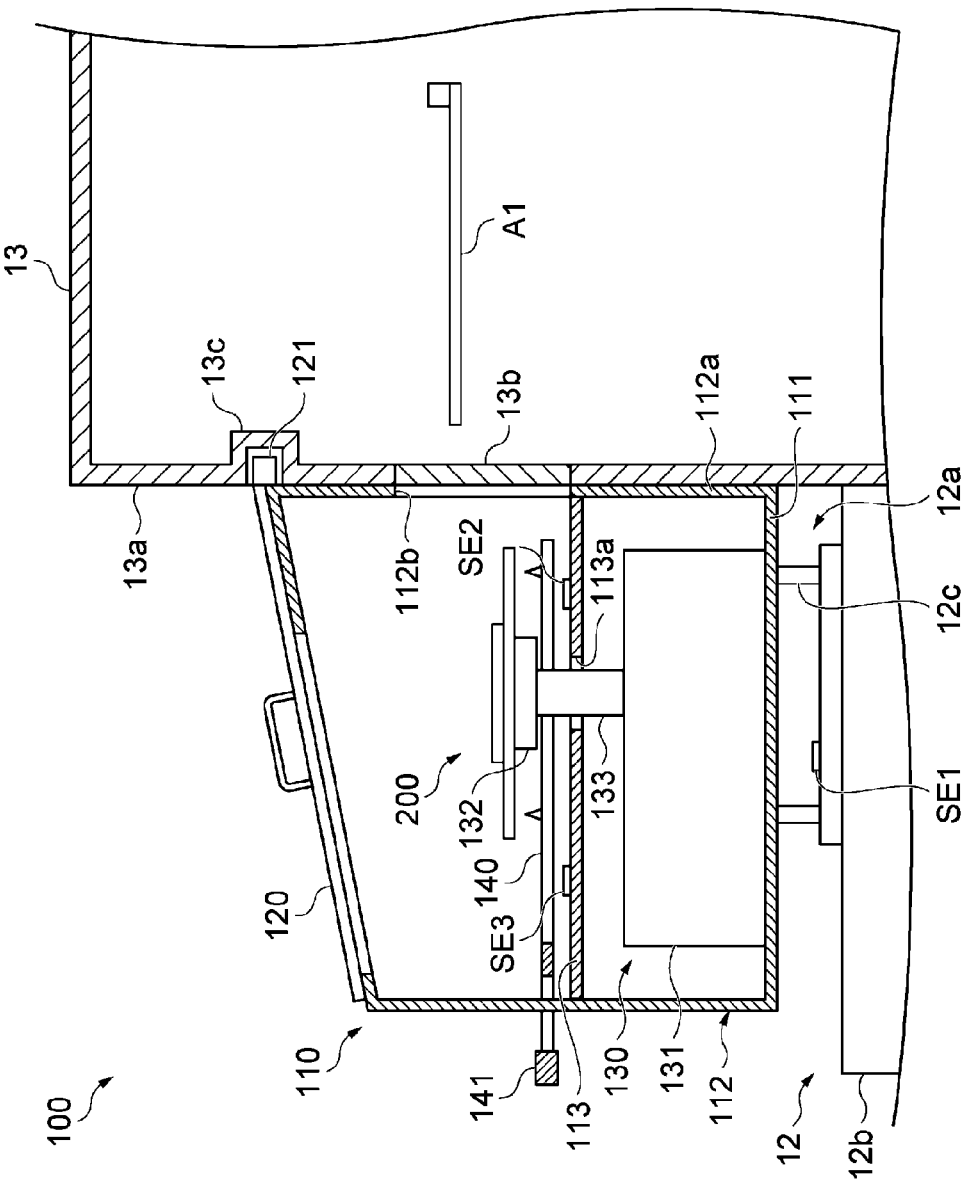

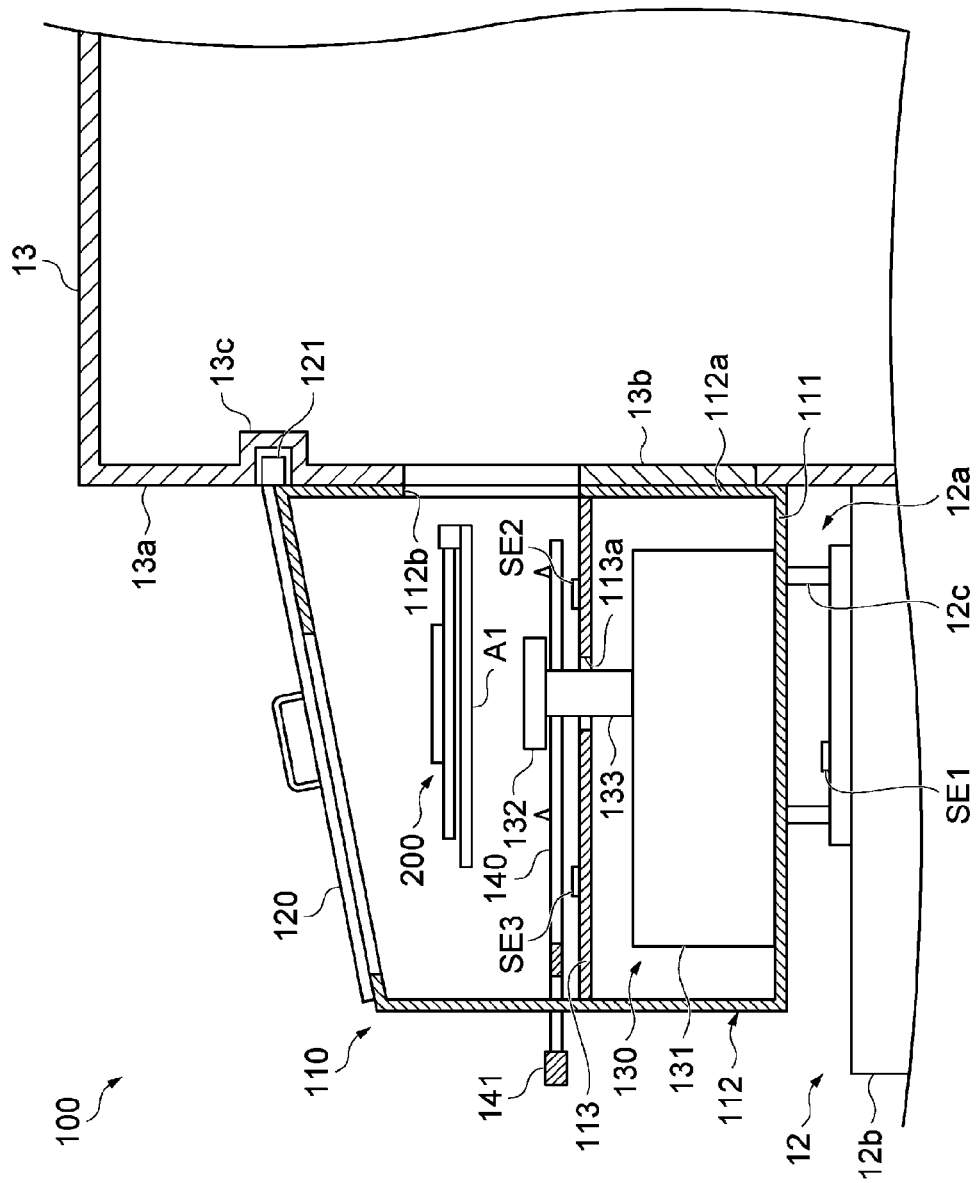

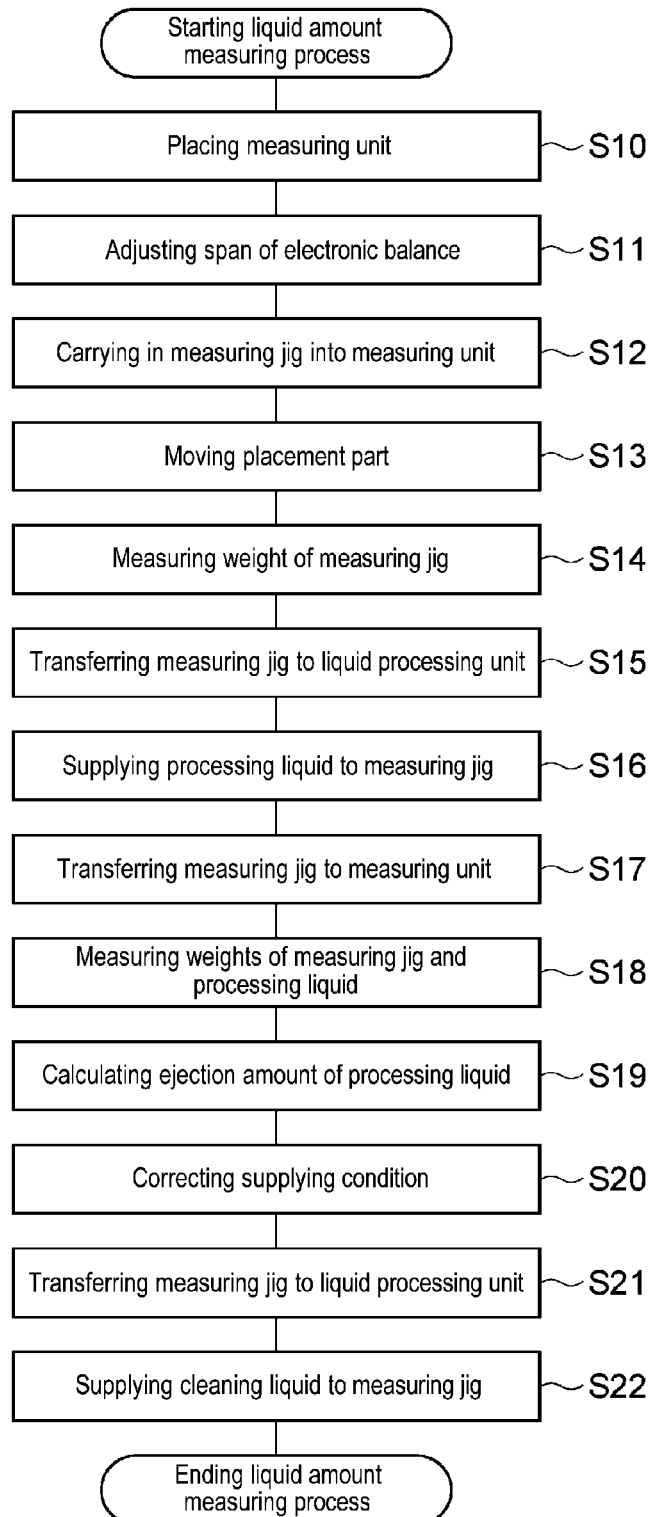

LIQUID AMOUNT MEASURING METHOD AND COMPUTER-READABLE RECORDING MEDIUM

CROSS-REFERENCE TO RELATED APPLICATION

This is a Divisional Application of U.S. patent application Ser. No. 17/522,050, filed Nov. 9, 2021, an application claiming benefit from Japanese Application No. 2020-190281, filed Nov. 16, 2020, the content of each of which is hereby incorporated by reference in its entirety.

TECHNICAL FIELD

The present disclosure relates to a substrate processing system, a liquid amount measuring method, and a non-transitory computer-readable recording medium.

BACKGROUND

In finely processing a substrate (e.g., a semiconductor wafer) to manufacture a semiconductor device, a substrate processing system in which various processing liquids are ejected onto the substrate to perform substrate processing has been known. Particularly, in recent years, further miniaturization of uneven patterns formed on the substrate has been promoted. Therefore, it is required to control an amount of a processing liquid to be ejected to the substrate with high accuracy.

In this regard, Patent Document 1 discloses a method of measuring an ejection amount of a processing liquid used for processing a substrate. The measuring method includes ejecting the processing liquid to a container main body inside a processing liquid supply unit, constituting a container by attaching a lid to the container main body to cover the processing liquid, and transferring the container main body to a measurer provided above the supply unit and measuring the amount of the processing liquid. Such a measurement operation is performed while adjusting the supply conditions of the processing liquid such that the ejection amount of the processing liquid falls within a predetermined range at the time of adjusting the substrate processing system (for example, at the time of initial setting, maintenance, or the like).

PRIOR ART DOCUMENT

Patent Document

Patent Document 1: Japanese Laid-Open Patent Publication No. 2018-098414

SUMMARY

A substrate processing system according to an embodiment includes: a placement stage including a placement portion configured to place thereon an accommodation container configured to accommodate a substrate; a measuring unit provided detachably with respect to the placement portion and configured to measure a weight of an object to be measured; a measuring jig configured to measure a processing liquid; a liquid processing unit including a supplier configured to supply the processing liquid to the substrate or the measuring jig; a transfer mechanism configured to transfer the substrate or the measuring jig between the measuring unit and the liquid processing unit; and a controller, wherein the controller is configured to execute: a first process of controlling the transfer mechanism to transfer the measuring jig in the measuring unit from the measuring unit to the liquid processing unit; a second process of controlling the liquid processing unit to eject the processing liquid from the supplier to the measuring jig after the first process; a third process of controlling the transfer mechanism to transfer the measuring jig from the liquid processing unit to the measuring unit after the second process; and a fourth process of calculating an ejection amount of the processing liquid based on a measurement value in the measuring unit after the third process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 14 is a diagram for explaining an example of the procedure for measuring the ejection amount of the processing liquid.

FIG. 15 is a diagram for explaining an example of the procedure for measuring the ejection amount of the processing liquid.

FIG. 17 is a flowchart for explaining the procedure for measuring the ejection amount of the processing liquid.

DETAILED DESCRIPTION

Figure 1:
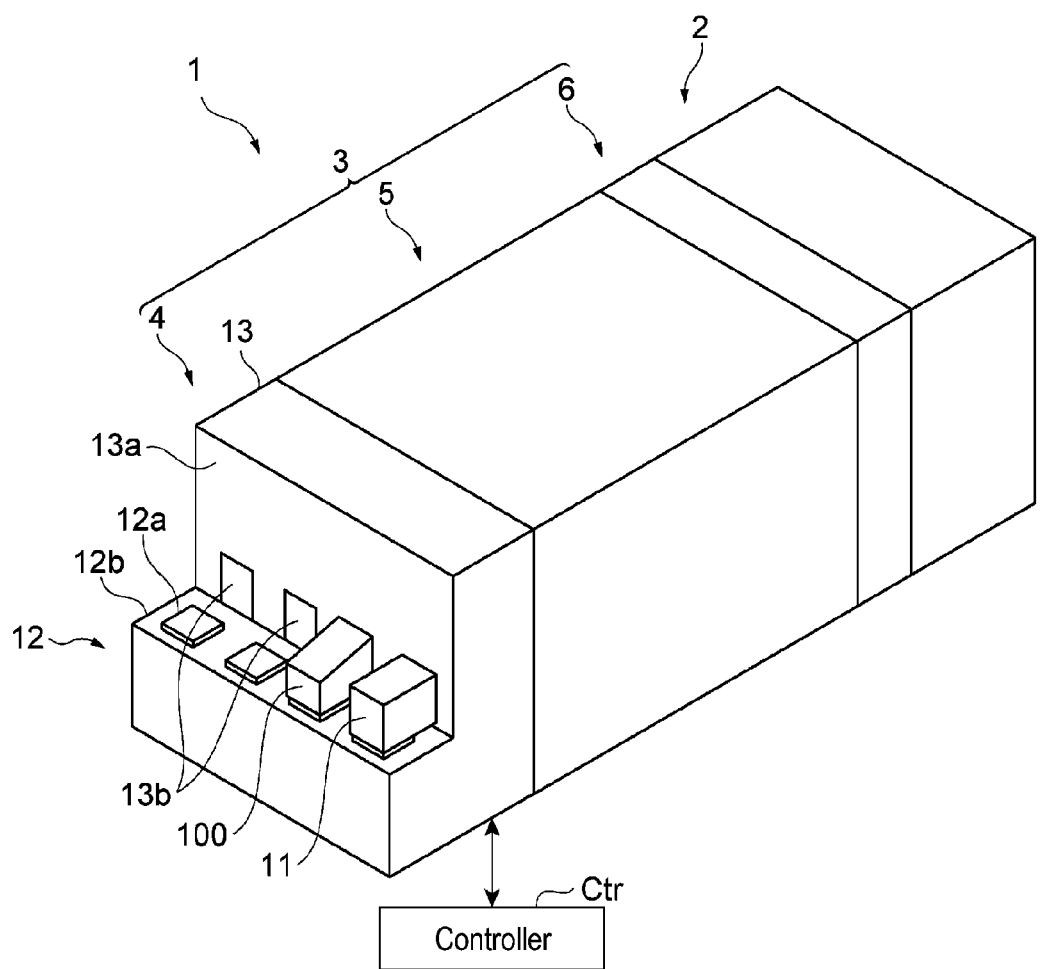
FIG. 1 is a perspective view illustrating an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the following description, the same reference numerals will be used for the same elements or elements having the same function, and redundant descriptions will be omitted.

Figure 2:
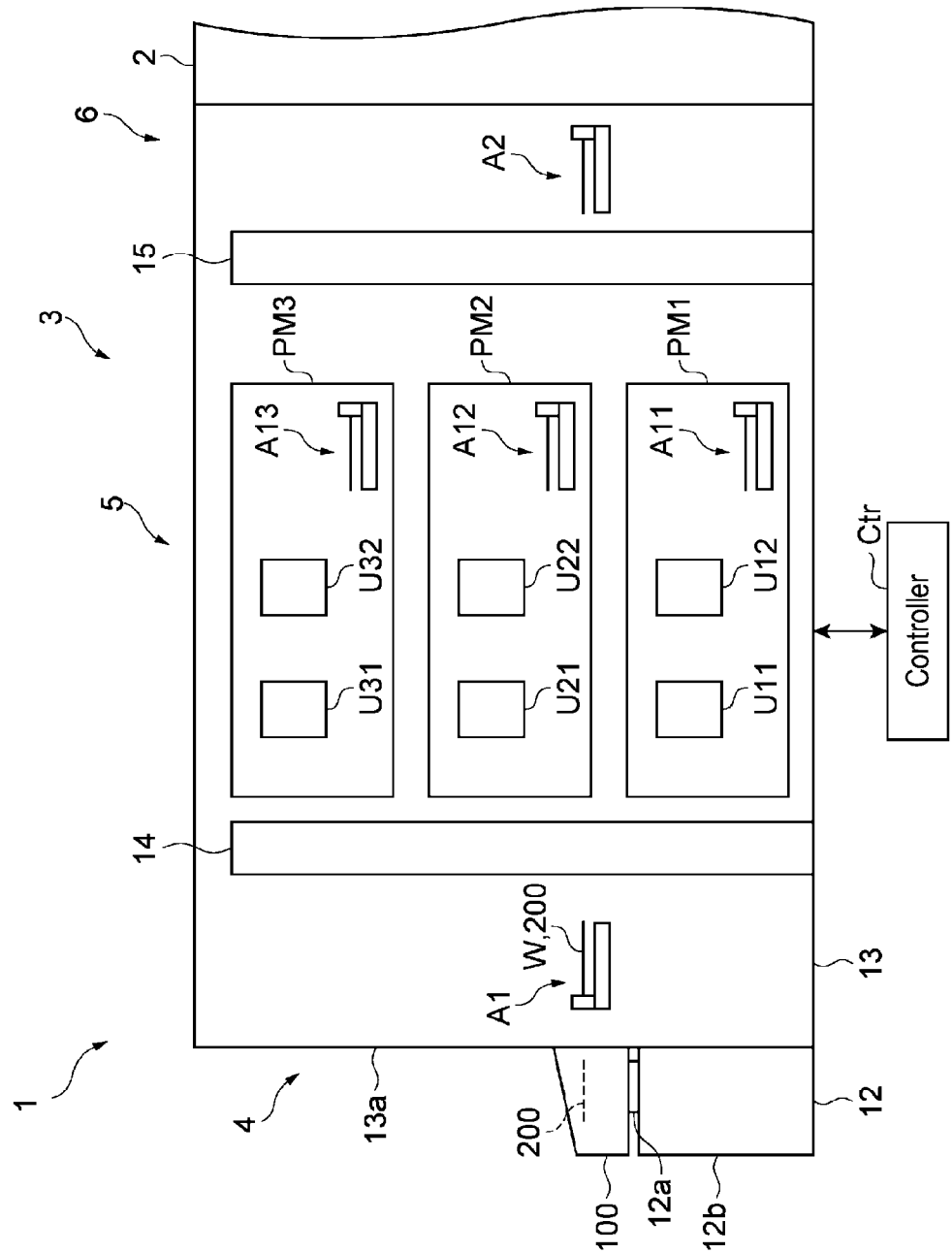
FIG. 2 is a side view schematically illustrating the interior of the substrate processing system of FIG. 1.

First, a configuration of a substrate processing system 1 will be described with reference to FIGS. 1 to 3. As illustrated in FIGS. 1 and 2, the substrate processing system 1 includes an exposure apparatus 2, a coating and developing apparatus 3 (a liquid amount measuring apparatus), and a controller Ctr (a control part).

The exposure apparatus 2 is configured to transfer a substrate W to and from the coating and developing apparatus 3 to perform an exposure process (pattern exposure) of a resist film formed on the surface of the substrate W. The exposure apparatus 2 may selectively irradiate an exposure target portion of the resist film with energy rays through a method such as immersion exposure.

The substrate W may have a disk shape or may have a plate shape other than a circular shape, such as a polygonal shape. The substrate W may have a cutout portion which is partially cut out. The cutout portion may be, for example, a notch (a groove having a U-shape, a V-shape, or the like) or a linear portion (so-called orientation flat) extending linearly. The substrate W may be, for example, a semiconductor substrate (a silicon wafer), a glass substrate, a mask substrate, a flat panel display (FPD) substrate, or various other substrates. The diameter of the substrate W may be, for example, about 200 mm to 450 mm.

The coating and developing apparatus 3 is configured to form a film (resist film or the like) on the surface of the substrate W before the exposure process by the exposure apparatus 2. The coating and developing apparatus 3 is configured to perform a developing process on the resist film after the exposure process.

The coating and developing apparatus 3 includes a carrier block 4 (an accommodation part), a processing block 5 (an accommodation part), and an interface block 6. The carrier block 4, the processing block 5, and the interface block 6 may be arranged in a row, for example, in the horizontal direction.

The carrier block 4 includes a carrier station 12 and a carry-in/out part 13. The carrier station 12 is configured to be able to place a plurality of carriers 11 (accommodation containers) and a measuring unit 100 thereon. Each carrier 11 is configured to accommodate at least one substrate W in a sealed state. The carrier 11 includes an opening/closing door (not illustrated) for taking in/out the substrate W therethrough.

The carrier station 12 includes a plurality of placement portions 12a and a placement stage 12b provided with the plurality of placement portions 12a. As illustrated in FIG. 3, the plurality of placement portions 12a are configured to be movable substantially horizontally on the placement stage 12b between a first position approaching the carry-in/out part 13 and a second position spaced away from the carry-in/out part 13.

Each placement portion 12a is configured to detachably support one carrier 11 or one measuring unit 100. The placement portion 12a includes support pins 12c configured to support the carrier 11 or the measuring unit 100, and a sensor SE1 configured to detect whether or not the carrier 11 or the measuring unit 100 is located on the support pins 12c. The sensor SE1 may be, for example, a photoelectric sensor.

The carry-in/out part 13 is located between the carrier station 12 and the processing block 5. As illustrated in FIGS. 1 and 3, the carry-in/out part 13 includes a sidewall 13a facing the placement stage 12b, a plurality of opening/closing doors 13b provided on the sidewall 13a, and a plurality of engaging portions 13c provided on the sidewall 13a.

The plurality of opening/closing doors 13b are arranged in a one-to-one relationship with the plurality of placement portions 12a. In the state in which the carrier 11 is placed on the placement portion 12a, when both the opening/closing door of the carrier 11 and the opening/closing door 13b of the carry-in/out part 13 are opened so that the interior of the carrier 11 and the interior of the carry-in/out part 13 communicate with each other.

The plurality of engaging portions 13c are disposed above the respective opening/closing doors 13b in a one-to-one relationship with the plurality of opening/closing doors 13b. The engaging portion 13c may be, for example, a concave portion recessed inward of the interior of the carry-in/out part 13 (see FIG. 3), or a convex portion protruding outward of the carry-in/out part 13.

Figure 3:
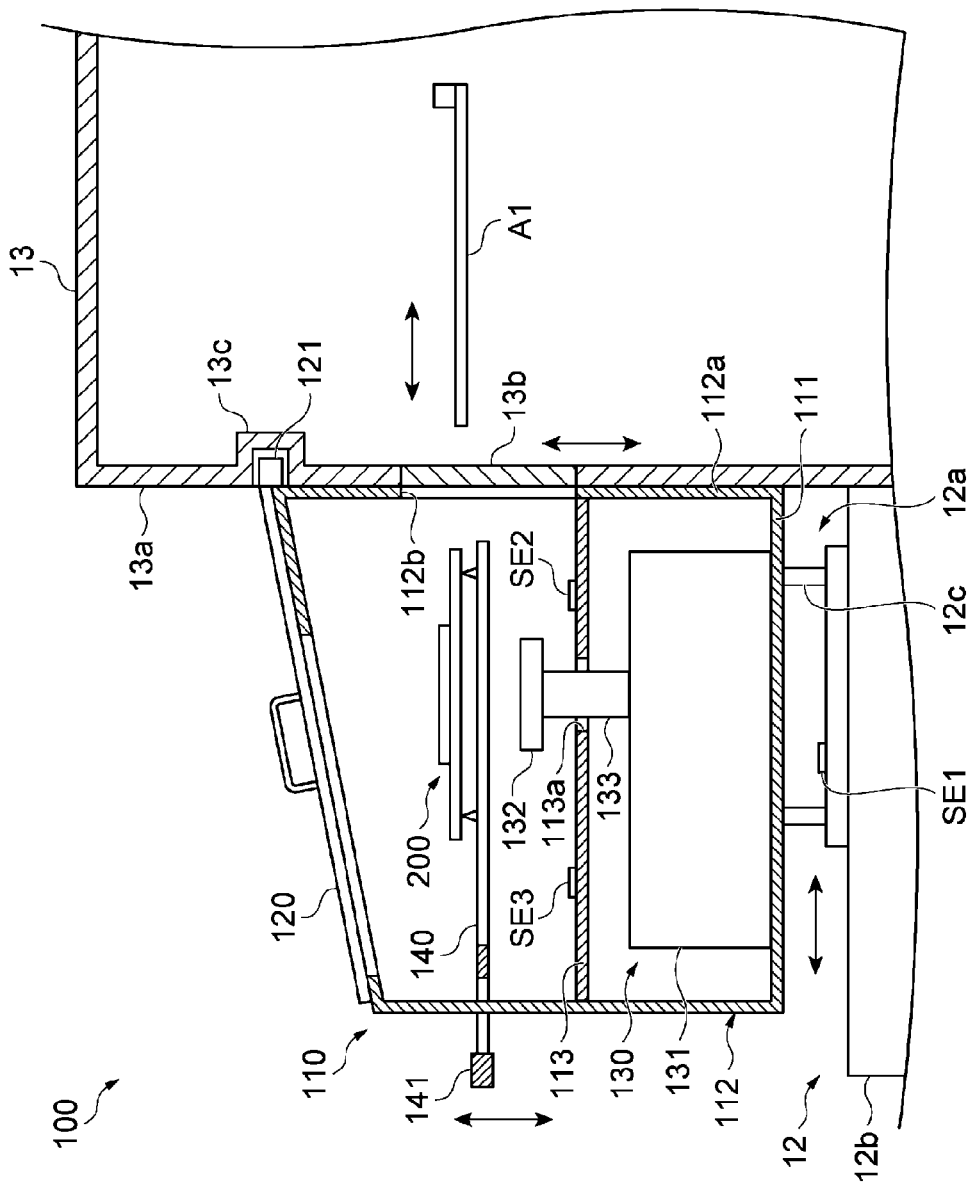
FIG. 3 is a cross-sectional view schematically illustrating the vicinity of a measuring unit and a carrier station.

As illustrated in FIGS. 2 and 3, the carry-in/out part 13 includes a transfer arm A1 (a transfer mechanism) provided therein. The transfer arm A1 is configured to take out the substrate W from the carrier 11 to deliver the substrate W to the processing block 5, and configured to receive the substrate W from the processing block 5 to return the substrate W to the interior of the carrier 11. The transfer arm A1 is configured to take out the measuring jig 200 (to be described later) from the measuring unit 100 to deliver the same to the processing block 5, and configured to receive the measuring jig 200 from the processing block 5 to return the same to the measuring unit 100.

As illustrated in FIG. 2, the processing block 5 includes processing modules PM1 to PM3 provided therein.

The processing module PM1 is configured to form an underlayer film on the substrate W. The processing module PM1 includes a liquid processing unit U11, a heat treatment unit U12, and a transfer arm A11 configured to transfer the substrate W to these units. The liquid processing unit U11 may be configured to supply, for example, a processing liquid for forming the underlayer film to the substrate W. The heat treatment unit U12 may be configured to perform a heat treatment for curing the film formed on the substrate W by the liquid processing unit U11 to form, for example, the underlayer film. Examples of the underlayer film may include an antireflective coating (SiARC) film, a spin-on-glass (SOG) film, a spin-on-carbon (SOC) film, an amorphous carbon film, and the like.

The processing module PM2 is configured to form a resist film on the underlayer film. The processing module PM2 includes a liquid processing unit U21, a heat treatment unit U22, and a transfer arm A12 (a transfer mechanism) configured to transfer the substrate W or the measuring jig 200 to these units. The liquid processing unit U21 may be configured to supply, for example, a processing liquid L1 for forming the resist film (see FIG. 7) to the substrate W. The heat treatment unit U22 may be configured to perform a heat treatment (pre-applied bake (PAB)) for curing a film formed on the substrate W by the liquid processing unit U21 to form, for example, a resist film.

The processing module PM3 is configured to develop the resist film exposed by the exposure apparatus 2. The processing module PM3 includes a liquid processing unit U31, a heat treatment unit U32, and a transfer arm A13 configured to transfer the substrate W to these units. The liquid processing unit U31 may be configured to supply, for example, a processing liquid (a developer) for partially removing the resist film and forming a resist pattern (not illustrated) to the substrate W. The heat treatment unit U32 may be configured to perform, for example, heat treatment before development (post-exposure bake (PEB)), heat treatment after development (post-bake (PB)), and the like.

As illustrated in FIG. 2, the processing block 5 includes a shelf unit 14 located in the vicinity of the carrier block 4 and a shelf unit 15 located in the vicinity of the interface block 6. The shelf unit 14 is configured to mediate the delivery of the substrate W between the carry-in/out part 13 and the processing modules PM1 to PM3. The shelf unit 15 is configured to mediate the delivery of the substrate W between the processing modules PM1 to PM3 and the interface block 6.

The interface block 6 includes a transfer arm A2 provided therein and is disposed between the processing block 5 and the exposure apparatus 2. The transfer arm A2 is configured to take out the substrate W in the shelf unit 15, deliver the same to the exposure apparatus 2, receive the substrate W from the exposure apparatus 2, and return the same to the shelf unit 15.

The controller Ctr is configured to partially or entirely control the coating and developing apparatus 3. The details of the controller Ctr will be described later. The controller Ctr may be configured to transmit/receive signals to/from the controller of the exposure apparatus 2 and to control the substrate processing system 1 as a whole in cooperation with the controller of the exposure apparatus 2.

[Measuring Unit]

Next, the measuring unit 100 will be described in detail with reference to FIG. 3. The measuring unit 100 is configured to measure the weight of an object to be measured (the measuring jig 200 and the processing liquid L1). The measuring unit 100 includes a housing 110, an opening/closing door 120, an electronic balance 130, and a delivery arm (a transfer member) 140.

The housing 110 is, for example, a bottomed cylindrical body, and is open upward. The housing 110 includes a bottom wall 111 and a sidewall 112 provided on the bottom wall 111 and extending upward from the bottom wall 111. The sidewall 112 includes a sidewall portion 112a facing the sidewall 13a of the carry-in/out part 13 in a state in which the measuring unit 100 is placed on the placement portion 12a.

When the placement portion 12a is located at a first position in the state in which the measuring unit 100 is placed on the placement portion 12a, the sidewall portion 112a is in contact with the sidewall 13a or is close to the sidewall 13a (see FIG. 3). The sidewall 13a includes an opening 112b formed to penetrate therethrough. The opening 112b is arranged at a position facing the opening/closing door 13b in the state in which the measuring unit 100 is placed on the placement portion 12a.

A partition wall 113 is arranged inside the housing 110. The partition wall 113 is provided to extend in the horizontal direction to vertically partition an internal space of the housing 110. The partition wall 113 is located below the opening 112b in the sidewall portion 112a. The partition wall 113 includes an opening 113a formed to penetrate therethrough.

Sensors SE2 and SE3 may be provided on the partition wall 113. The sensor SE2 is configured to detect whether or not the measuring jig 200 is supported by the delivery arm 140. The sensor SE3 is configured to detect whether or not the delivery arm 140 is located in the vicinity of the partition wall 113. The sensors SE2 and SE3 may be, for example, photoelectric sensors.

The opening/closing door 120 is provided to the opening in the upper portion of the housing 110 (the sidewall 112). The opening/closing door 120 is configured to be openable/closable between an open state in which access to the interior and exterior of the housing 110 is enabled and a closed state in which the opening in the upper portion of the housing 110 (the sidewall 112) is covered. Therefore, when the opening/closing door 120 is in the open state, the measuring jig 200 can be taken in and out with respect to the housing 110.

An engaged portion 121 is provided at the end of the opening/closing door 120 on the sidewall portion 112a side. The engaged portion 121 is configured to be engageable with an engaging portion 13c of the sidewall 13a. More specifically, the engaged portion 121 is configured to be engaged with the engaging portion 13c when the placement portion 12a is located at the first position in the state in which the measuring unit 100 is placed on the placement portion 12a and the opening/closing door 120 is closed.

In the state in which the engaged portion 121 is engaged with the engaging portion 13c, the opening/closing operation of the opening/closing door 120 is restrained (locked) while the closed state of the opening/closing door 120 is maintained. The engaged portion 121 may be, for example, a convex portion that enters a concave portion when the engaging portion 13c is the concave portion or may be a contact portion that is in contact with the bottom surface of a convex portion when the engaging portion 13c is the convex portion.

The electronic balance 130 includes a main body 131, a weighing pan 132, and a support member 133. The electronic balance 130 is configured to measure the weight of an object to be measured placed on the weighing pan 132 in the main body 131. The main body 131 is arranged in a space (a lower space) below the partition wall 113 in the housing 110. The weighing pan 132 is arranged in a space (upper space) above the partition wall 113 in the housing 110. The support member 133 extends in the vertical direction through the opening 113a to interconnect the main body 131 and the weighing pan 132. Therefore, the electronic balance 130 is accommodated in the housing 110.

The delivery arm 140 is configured to move in the vertical direction in the upper space of the housing 110. The delivery arm 140 may be configured to be manually moved by an operator, or may be configured to be automatically moved by the controller Ctr. In the former case, as illustrated in FIG. 3, a grip portion 141 of the delivery arm 140 may be located outside the housing 110.

When the delivery arm 140 is located above the weighing pan 132 of the electronic balance 130, the operator may dispose the measuring jig 200 on the delivery arm 140. When the delivery arm 140 descends to the lower side of the weighing pan 132 of the electronic balance 130 in the state in which the delivery arm 140 supports the measuring jig 200, the measuring jig 200 supported by the delivery arm 140 is delivered to the weighing plate 132 during that process. That is, the delivery arm 140 is configured to support the measuring jig 200 and deliver the measuring jig 200 to the weighing pan 132.

[Measuring Jig]

Figure 4:
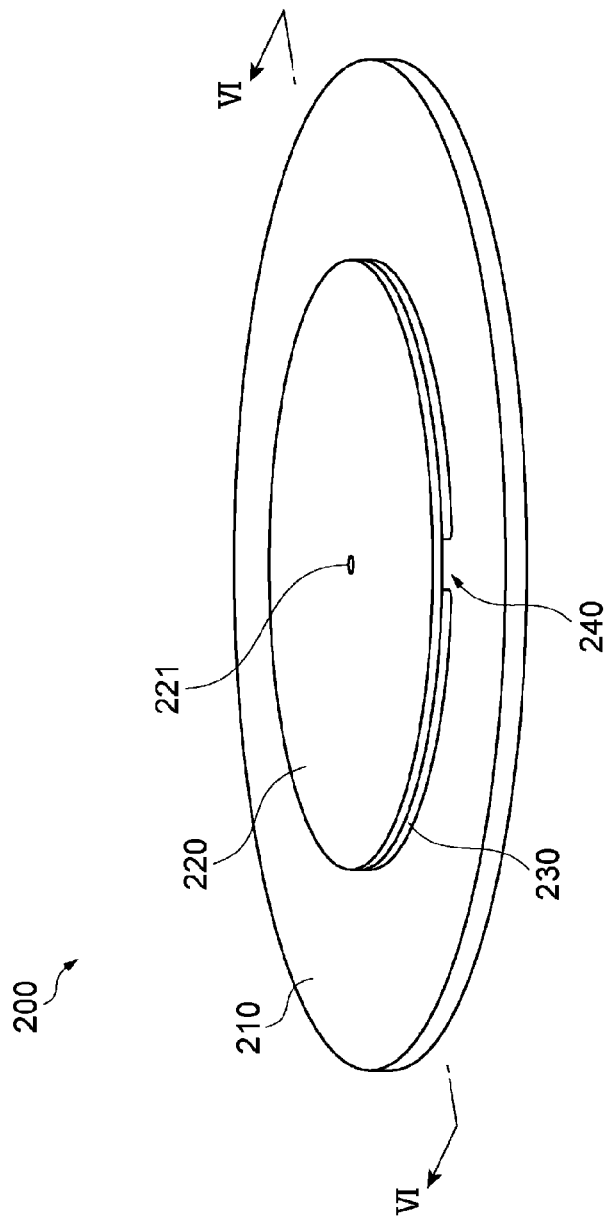
FIG. 4 is a perspective view illustrating an example of a measuring jig.
Figure 5:
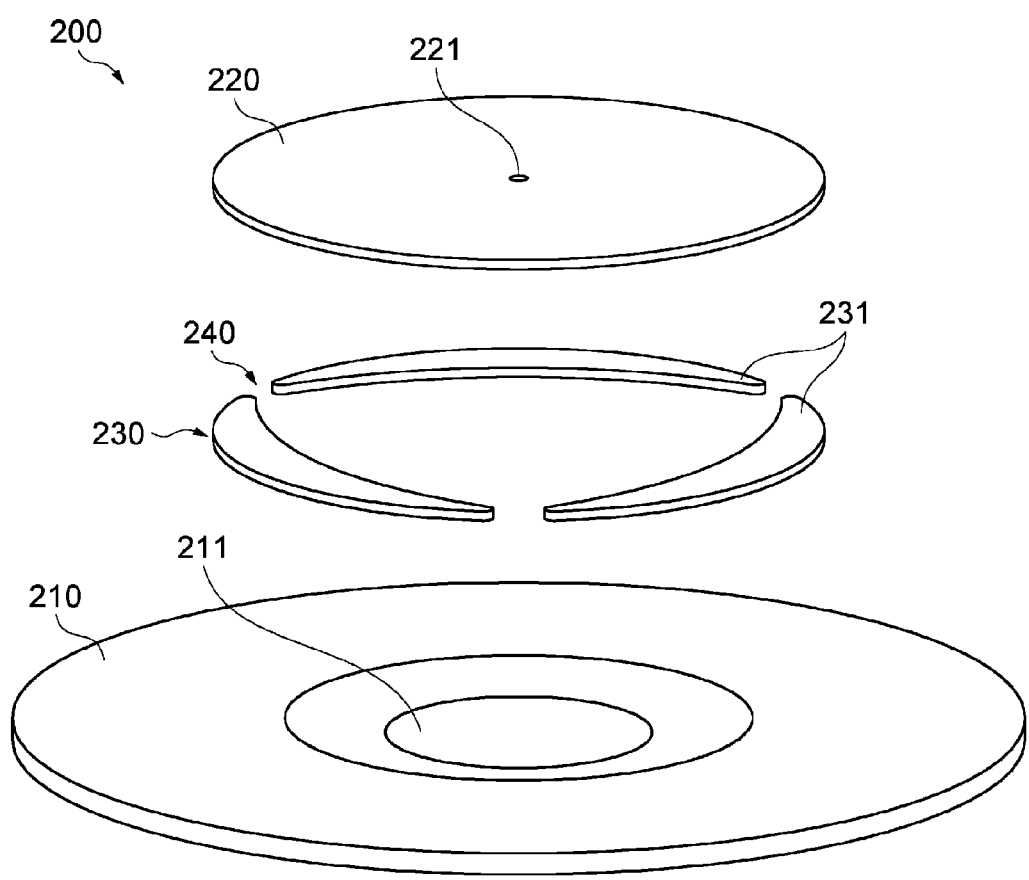
FIG. 5 is an exploded perspective view illustrating the measuring jig of FIG. 4.
Figure 6:
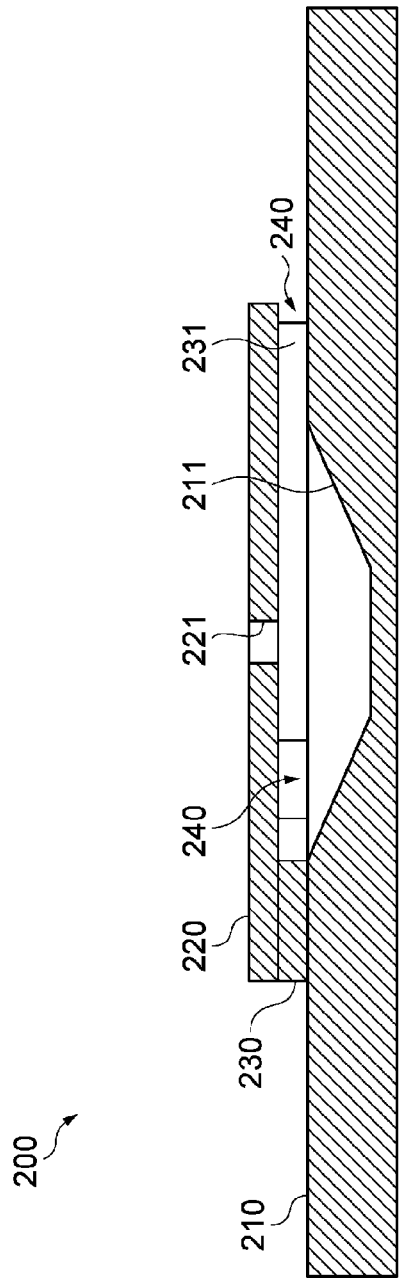
FIG. 6 is a cross-sectional view taken along line VI-VI in FIG. 4.

Next, the measuring jig 200 will be described in detail with reference to FIGS. 4 to 6. The measuring jig 200 is a tool used for measuring the ejection amount of the processing liquid L1. The measuring jig 200 includes a base member 210, a lid member 220, and a plurality of wall members 230.

The base member 210 is configured to support the lid member 220 and the plurality of wall members 230. The base member 210 has, for example, a disk shape, and may have the same size as that of the substrate W. As shown in FIGS. 5 and 6, a recess 211 recessed downward is formed in the top surface and the central portion of the base member 210. The recess 211 may have a mortar shape, the diameter of which is reduced toward the bottom.

The lid member 220 is located above the base member 210 to overlap the entire recess 211 when viewed from above. The lid member 220 has, for example, a disk shape and may be smaller than the base member 210. A through-hole 221 is formed in the central portion of the lid member 220. The through-hole 221 functions as a supply port through which the processing liquid L1 or a cleaning liquid L2, which will be described later, is supplied to the recess 211. The size of the through-hole 221 is set to be about the same as or slightly larger (e.g., about +10% to +20%) than a diameter of an ejection port of a nozzle 34, which will be described later, from the viewpoint of suppressing the volatilization of the processing liquid L1.

The plurality of wall members 230 are located between the base member 210 and the lid member 220 and join the base member 210 and the lid member 220. Therefore, when viewed from a side, a stepped portion is formed between an outer peripheral edge of the lid member 220 and the base member 210. The plurality of wall members 230 may have, for example, an arc shape. The plurality of wall members 230 may be arranged to form an annular shape as a whole to surround the recess 211 and the through-hole 221 when viewed from above (when viewed from a direction in which the base member 210 and the lid member 220 are arranged). That is, the plurality of wall members 230 may be arranged along the opening edge of the recess 211.

The plurality of wall members 230 may be spaced apart from each other. A gap between adjacent wall members 230 among the plurality of wall members 230 functions as a drainage port 240 through which the processing liquid L1 or the cleaning liquid L2 in the recess 211 is discharged from the internal space of the measuring jig 200 (a space surrounded by the base member 210, the lid member 220, and the plurality of wall members 230).

In one wall member 230 and the other wall member 230, which are adjacent to each other among the plurality of wall members 230, the end portion 231 of the one wall member 230 facing the other wall member 230 may have a tapered shape, the width of which is narrowed toward the other wall member 230. The end portion 231 of the other wall member 230 facing the one wall member 230 may have a tapered shape, the width of which is narrowed toward the one wall member 230.

[Liquid Processing Unit]

Figure 7:
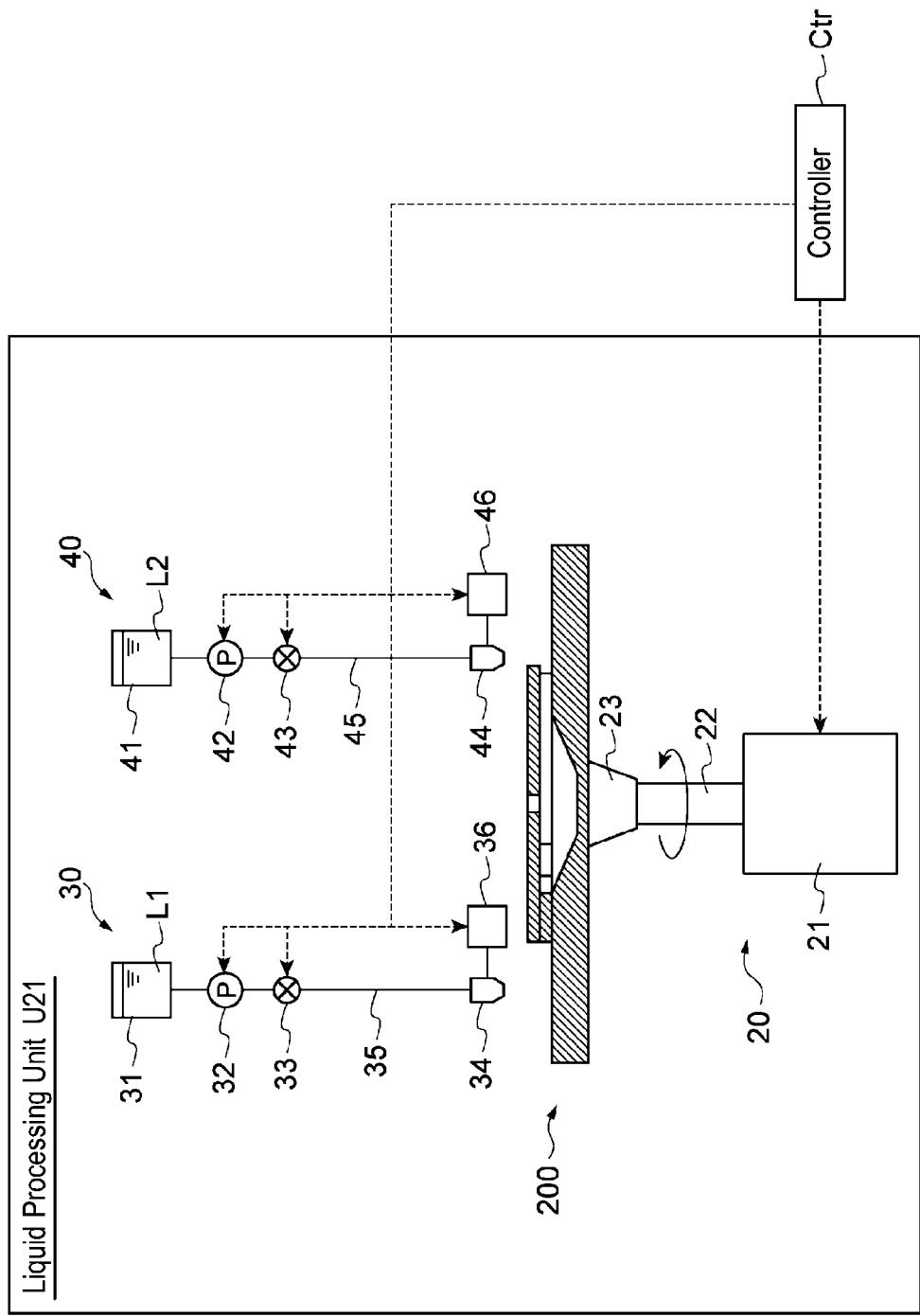
FIG. 7 is a side view schematically illustrating an example of a liquid processing unit.

Next, the liquid processing unit U21 will be described in detail with reference to FIG. 7. The liquid processing unit U21 includes a rotation holder 20, a liquid supplier 30 (a supplier), and a liquid supplier 40 (a supplier).

The rotation holder 20 includes a rotation part 21, a shaft 22, and a holder 23. The rotation part 21 operates based on an operation signal from the controller Ctr and is configured to rotate the shaft 22. The rotation part 21 may be a power source such as, for example, an electric motor. The holder 23 is provided at the tip end of the shaft 22. The holder 23 is configured to hold the substrate W or the measuring jig 200 substantially horizontally by, for example, suction or the like. That is, the rotation holder 20 is configured to rotate the substrate W or the measuring jig 200 around a central axis (a rotation axis) perpendicular to the surface of the substrate W or the measuring jig 200 in the state in which the posture of the substrate W or the measuring jig 200 is substantially horizontal. As illustrated in FIG. 7, the rotation holder 20 may rotate the substrate W or the measuring jig 200 counterclockwise when viewed from above.

The liquid supplier 30 is configured to supply the processing liquid L1 (a resist liquid) to the substrate W or the measuring jig 200. The resist material contained in the resist liquid may be a positive resist material or a negative resist material. The positive resist material is a resist material in which the exposed pattern portion is melted and the unexposed pattern portion (light-blocked portion) remains. The negative resist material is a resist material in which the unexposed pattern portion (light-blocked portion) is melted and the exposed pattern portion remains.

The liquid supplier 30 includes a liquid source 31, a pump 32, a valve 33, a nozzle 34, a pipe 35, and a driving mechanism 36. The liquid source 31 functions as a supply source for the processing liquid L1. The pump 32 operates based on an operation signal from the controller Ctr, suctions the processing liquid L1 from the liquid source 31, and sends the processing liquid L1 to the nozzle 34 via the pipe 35 and the valve 33.

The nozzle 34 is disposed above the substrate W or the measuring jig 200 such that the ejection port thereof faces the surface of the substrate W or the measuring jig 200. The nozzle 34 is configured to eject the processing liquid L1 pumped from the pump 32 from the ejection port thereof. The pipe 35 connects the liquid source 31, the pump 32, the valve 33, and the nozzle 34 in this order from the upstream side. The driving mechanism 36 is configured to operate based on a signal from the controller Ctr and to move the nozzle 34 in the horizontal direction and the vertical direction.

The liquid supplier 40 is configured to supply the cleaning liquid L2 (e.g., an organic solvent) to the substrate W or the measuring jig 200. The liquid supplier 40 includes a liquid source 41, a pump 42, a valve 43, a nozzle 44, a pipe 45, and a driving mechanism 46. The liquid source 41 functions as a supply source for the cleaning liquid L2. The pump 42 suctions the cleaning liquid L2 from the liquid source 41 and pumps the cleaning liquid L2 to the nozzle 44 via the pipe 45 and the valve 43.

The nozzle 44 is disposed above the substrate W or the measuring jig 200 such that the ejection port thereof faces the surface of the substrate W or the measuring jig 200. The nozzle 44 is configured to eject the cleaning liquid L2 pumped from the pump 42 from the ejection port thereof. The pipe 45 connects the liquid source 41, the pump 42, the valve 43, and the nozzle 44 in this order from the upstream side. The driving mechanism 46 is configured to operate based on an operation signal from the controller Ctr and to move the nozzle 44 in the horizontal direction and the vertical direction.

[Details of Controller]

Figure 8:
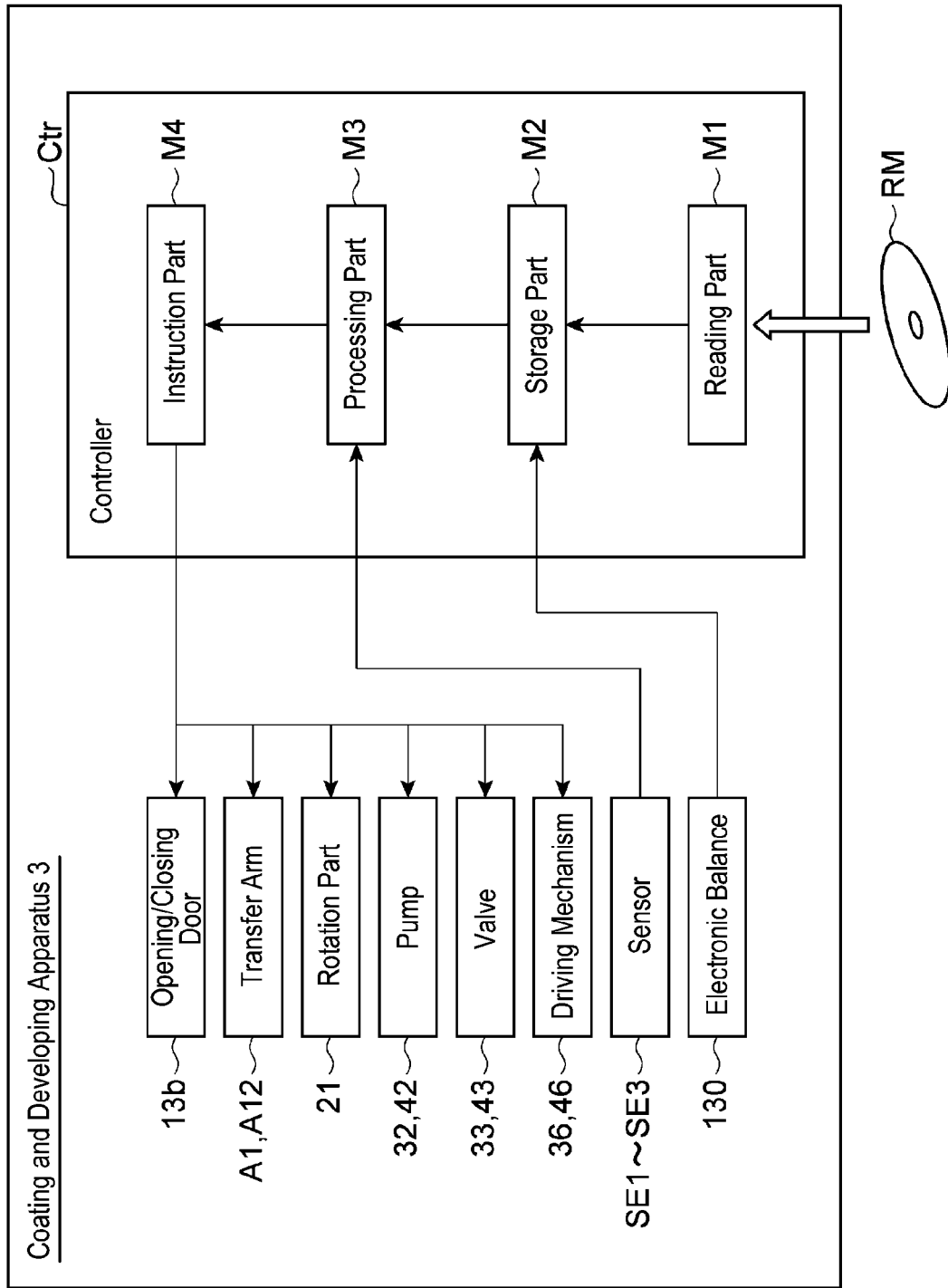
FIG. 8 is a block diagram illustrating an example of main parts of the substrate processing system.

As illustrated in FIG. 8, the controller Ctr includes a reading part M1, a storage part M2, a processing part M3, and an instruction part M4 as functional modules. These functional modules merely correspond to the functions of the controller Ctr divided into a plurality of modules for the sake of convenience in description, which does not necessarily mean that the hardware constituting the controller Ctr is divided into such modules. Each functional module is not limited to that implemented by executing a program and may be realized by a dedicated electric circuit (e.g., a logic circuit) or an integrated circuit in which the electric circuit is integrated (application-specific integrated circuit (ASIC)).

The reading part M1 is configured to read a program from a non-transitory computer-readable recording medium RM. The recording medium RM records a program for operating each part of the coating and developing apparatus 3. The recording medium RM may be, for example, a semiconductor memory, an optical recording disk, a magnetic recording disk, or a magneto-optical recording disk.

The storage part M2 is configured to store various pieces of data. The storage part M2 stores, for example, a program read from the recording medium RM by the reading part M1, setting data input via an external input device (not illustrated) by an operator, and the like. The storage part M2 may store, for example, a target value of the ejection amount of the processing liquid L1 and weight data received from the electronic balance 130.

The processing part M3 is configured to process various pieces of data. The processing part M3 may generate signals for operating respect parts of the coating and developing apparatus (e.g., the opening/closing door 13b, the transfer arms A1 and A12, the rotation part 21, the pumps 32 and 42, the valves 33 and 43, the driving mechanisms 36 and 46) based on, for example, various pieces of data stored in the storage part M2 and data received from the sensors SE1 to SE3.

The instruction part M4 is configured to transmit operation signals generated by the processing part M3 to respective parts of the coating and developing apparatus 3 (e.g., the opening/closing door 13b, the transfer arms A1 and A12, the rotation part 21, the pumps 32 and 42, the valves 33 and 43, and the driving mechanisms 36 and 46).

The instruction part M4 may execute a first process of controlling the transfer arms A1 and A12 to transfer the measuring jig 200 in the measuring unit 100 from the measuring unit 100 to the liquid processing unit U21. After the first process, the instruction part M4 may execute a second process of controlling the liquid supplier 30 to eject the processing liquid L1 from the liquid supplier 30 to the measuring jig 200. In the second process, the liquid supplier 30 may discharge the processing liquid L1 into the internal space (the recess 211) of the measuring jig 200 through the through-hole 221 of the lid member 220.

After the second process, the instruction part M4 may execute a third process of controlling the transfer arms A1 and A12 to transfer the measuring jig 200 from the liquid processing unit U21 to the measuring unit 100. After the third process, the instruction part M4 may execute a fourth process of calculating the ejection amount of the processing liquid L1 based on a value measured by the measuring unit 100. In the fourth process, the instruction part M4 may calculate the ejection amount of the processing liquid L1 based on a difference between the total weight of the processing liquid L1 ejected in the second process along with the measuring jig 200 and the weight of the measuring jig 200 itself measured in advance in the measuring unit 100.

After the fourth process, the instruction part M4 may execute a fifth process of controlling the transfer arms A1 and A12 to transfer the measuring jig 200 in the measuring unit 100 from the measuring unit 100 to the liquid processing unit U21. After the fifth process, the instruction part M4 may execute a sixth process of controlling the liquid supplier 40 to eject the cleaning liquid L2 from the liquid supplier 40 to the measuring jig 200. In the sixth process, the liquid supplier 40 may eject the cleaning liquid L2 to the top surface of the lid member 220 (a region of the lid member 220 different from the through-hole 221) after ejecting the cleaning liquid L2 into the internal space (the recess 211) of the measuring jig 200 through the through-hole 221 in the lid member 220. In the sixth process, the instruction part M4 may control the rotation holder 20 and the liquid supplier 40 to eject the cleaning liquid L2 from the liquid supplier 40 to the measuring jig 200 in a state in which the measuring jig 200 held by the rotation holder 20 is rotated.

The instruction part M4 may determine whether or not the difference between the target value of the ejection amount of the processing liquid L1 stored in the storage part M2 and the ejection amount of the processing liquid L1 calculated in the fourth process falls within a predetermined range. When the difference is out of the predetermined range as a result of the determination, the instruction part M4 may further execute a seventh process of correcting a supply condition of the processing liquid L1 in the liquid supplier 30. The supply condition may be, for example, an ejection pressure of the pump 32 or an opening degree of the valve 33 (a flow rate of the processing liquid L1).

Figure 9:
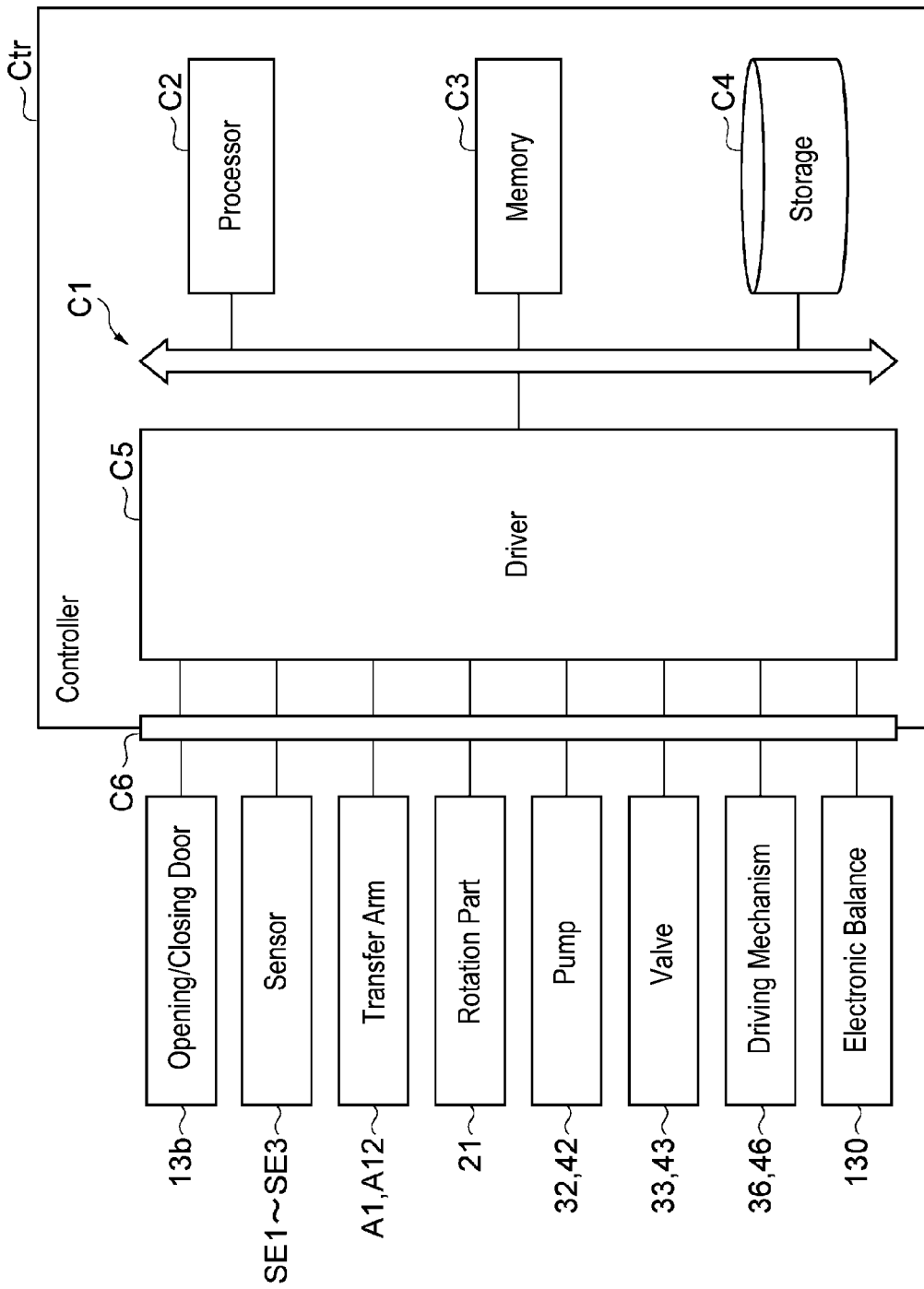
FIG. 9 is a schematic view illustrating an example of a hardware configuration of a controller.

The hardware of the controller Ctr may be configured with, for example, one or more control computers. As illustrated in FIG. 9, the controller Ctr may include a circuit C1 as a hardware configuration. The circuit C1 may be configured with electric circuit elements (circuitry). The circuit C1 may include, for example, a processor C2, a memory C3, a storage C4, a driver C5, and an input/output port C6.

The processor C2 may be configured to implement the above-described respective function modules by executing a program in cooperation with at least one of the memory C3 and the storage C4 and executing input/output of a signal via the input/output port C6. The memory C3 and the storage C4 may function as the storage part M2. The driver C5 may be a circuit configured to drive each part of the coating and developing apparatus 3. The input/output port C6 may be configured to mediate the input/output of a signal between the driver C5 and each part of the coating and developing apparatus 3.

The coating and developing apparatus 3 may include one controller Ctr, or may include a controller group (a control part) including a plurality of controllers Ctr. When the coating and developing apparatus 3 includes the controller group, each of the above-mentioned functional modules may be implemented by one controller Ctr or may be implemented by a combination of two or more controller Ctr. When the controller Ctr is configured with a plurality of computers (the circuit C1), each of the above-mentioned functional modules may be implemented by one computer (the circuit C1), or a combination of two or more computers (the circuit C1). The controller Ctr may include a plurality of processors C2. In this case, each of the functional modules may be implemented by one processor C2 or may be implemented by a combination of two or more processors C2.

Some or all of the functions of the controller Ctr of the coating and developing apparatus 3 may be implemented by a controller provided in an apparatus (e.g., a management apparatus) different from the coating and developing apparatus 3. In this case, the controller of the other device and one or more coating and developing apparatuses 3 may be connected to each other via, for example, a network. In this case, the operation of one or more coating and developing apparatuses 3 can be collectively managed and controlled remotely.

[Liquid Amount Measuring Method]

Figure 10:
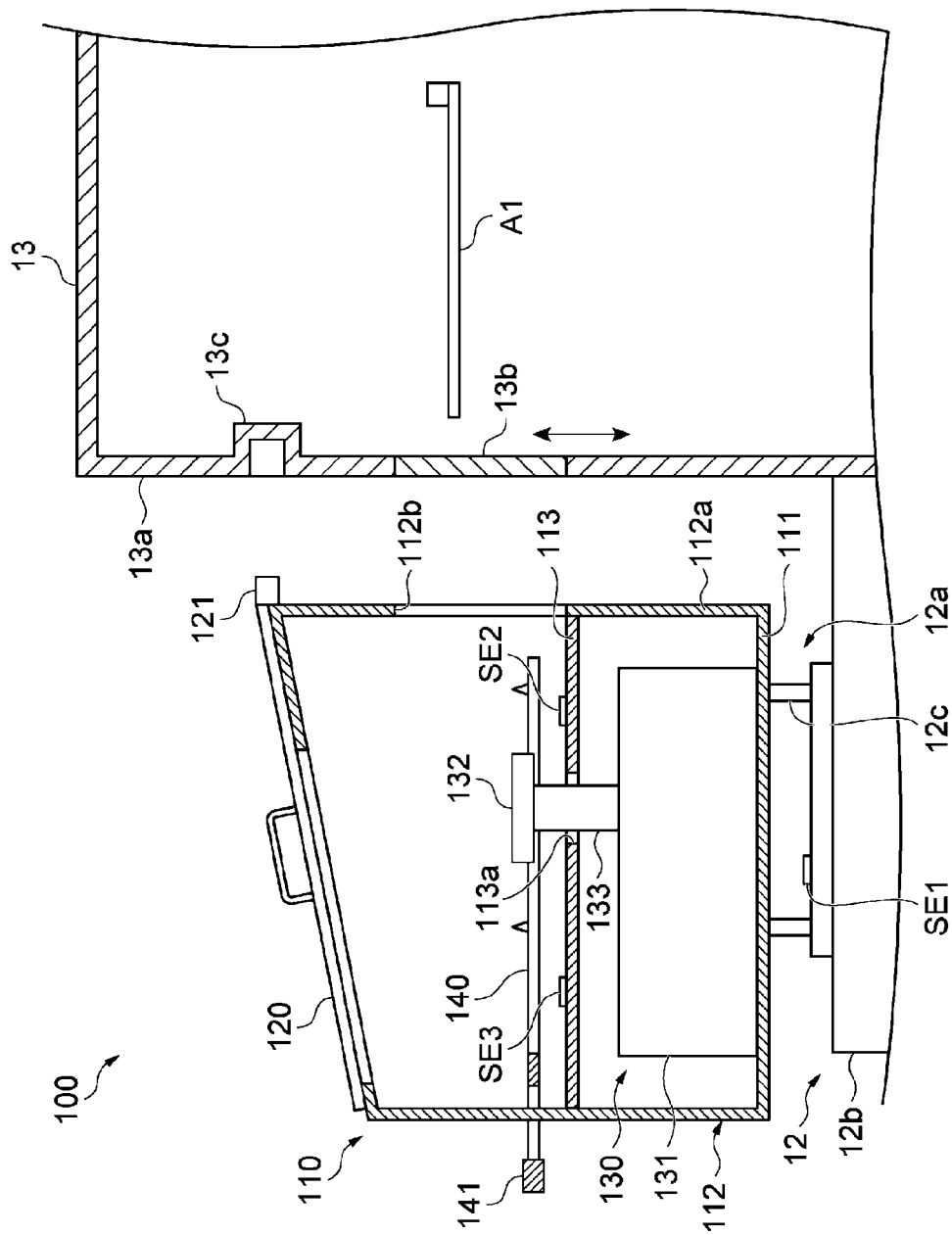
FIG. 10 is a diagram for explaining an example of a procedure for measuring an ejection amount of a processing liquid.

Next, a method of measuring the ejection amount of the processing liquid L1 will be described with reference to FIGS. 10 to 17. First, as illustrated in FIG. 10, the measuring unit 100 is placed on the placement portion 12*a* located at the second position spaced away from the carry-in/out part 13 (see step S10 in FIG. 17). At this time, the measuring jig 200 is not disposed inside the measuring unit 100. When the sensor SE1 detects that the measuring unit 100 is placed on the placement portion 12*a*, the process proceeds to the next step.

Figure 11:
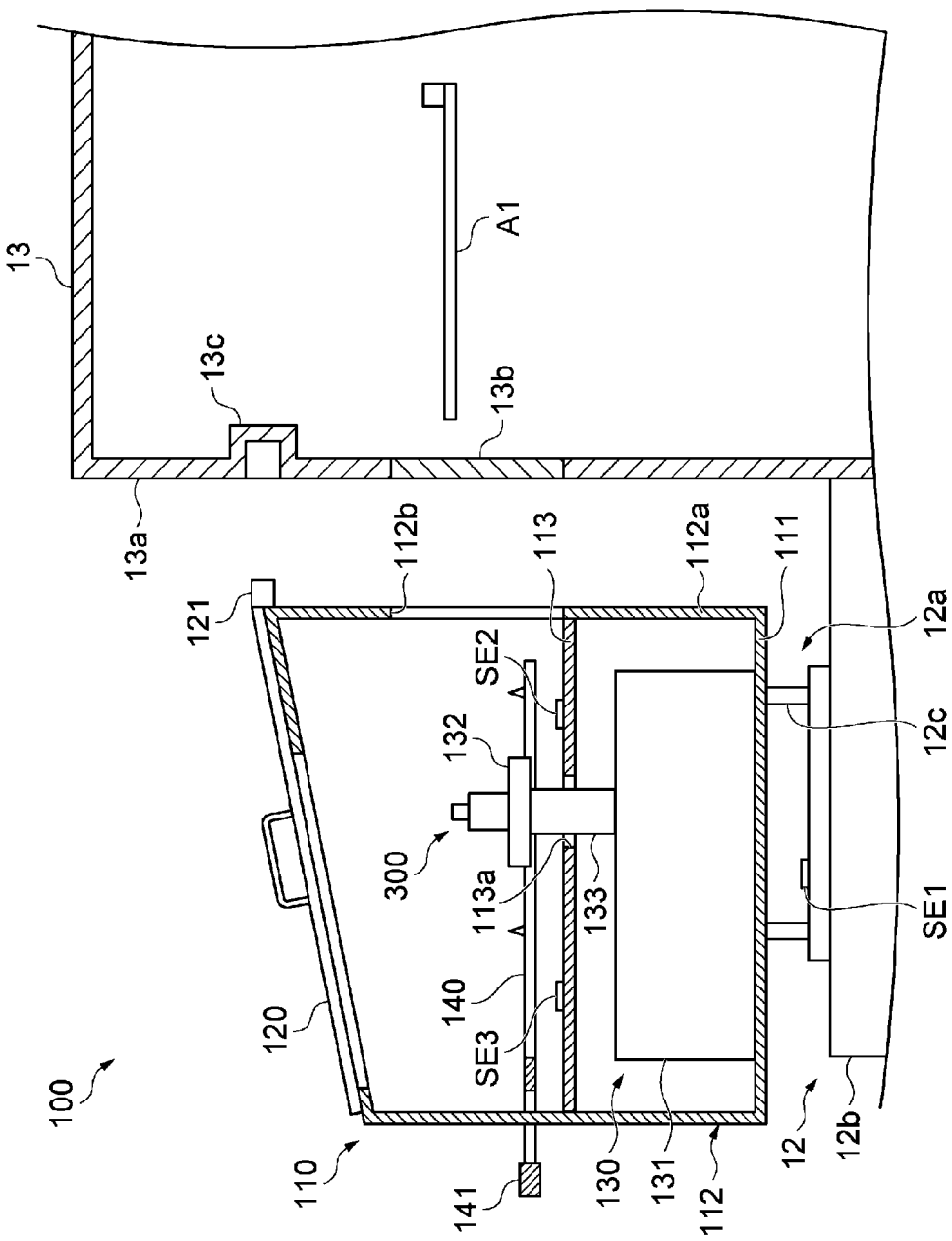
FIG. 11 is a diagram for explaining an example of the procedure for measuring the ejection amount of the processing liquid.

Subsequently, as illustrated in FIG. 11, span adjustment (calibration) of the electronic balance 130 is performed (see step S11 in FIG. 17). For example, the opening/closing door 120 is opened, a calibration weight 300 is placed on the weighing pan 132, and calibration of a weighing point is performed.

Figure 12:
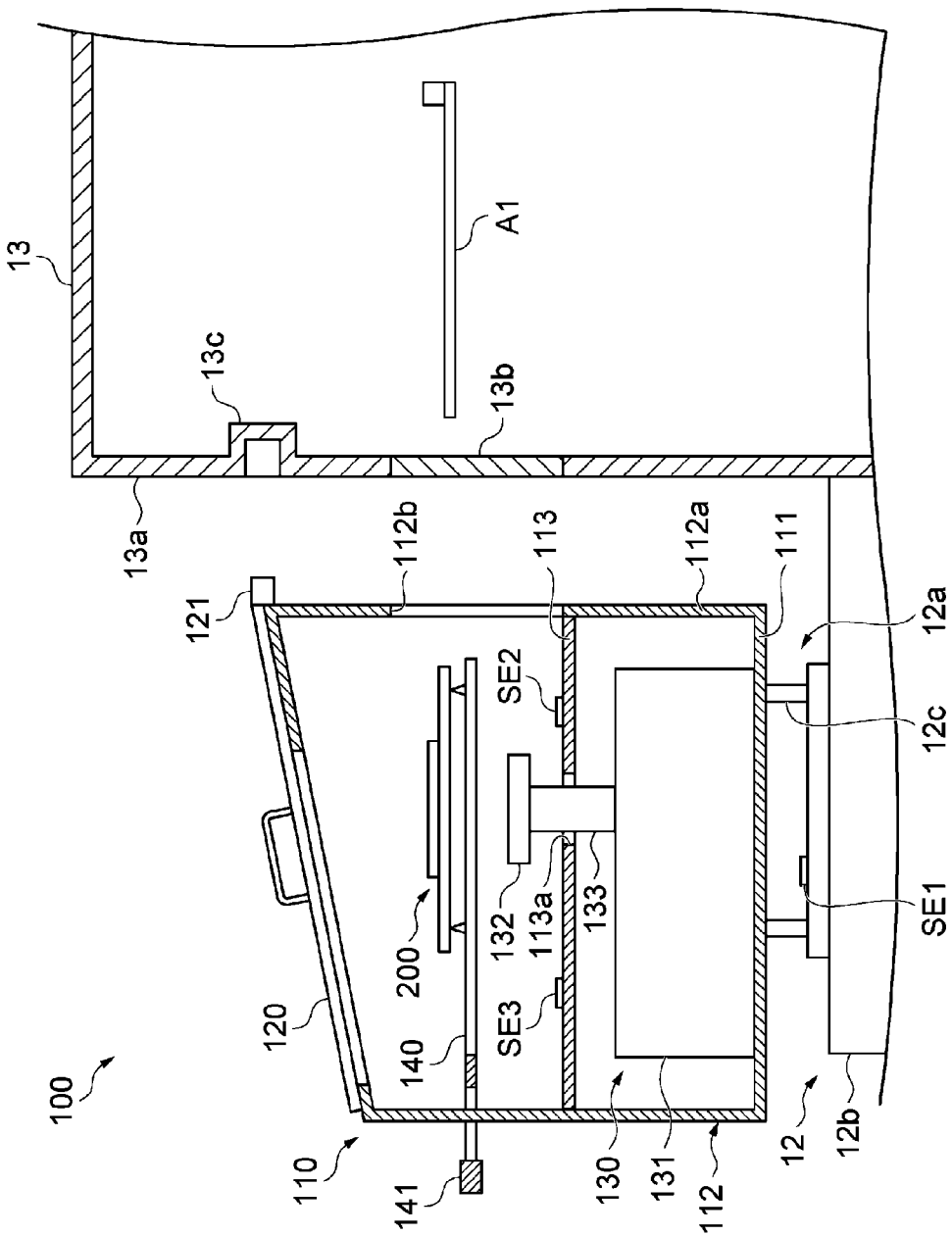
FIG. 12 is a diagram for explaining an example of the procedure for measuring the ejection amount of the processing liquid.

Subsequently, as illustrated in FIG. 12, for example, the measuring jig 200 is placed on the transfer arm 140 in the state in which the operator moves the transfer arm 140 above the weighing pan 132 by operating the grip part 141. Thereafter, the opening/closing door 120 is closed. As a result, the measuring jig 200 is carried into the measuring unit 100 (see step S12 in FIG. 17). When the sensor SE2 detects that the measuring jig 200 is placed on the transfer arm 140, the process proceeds to the next step.

Figure 13:
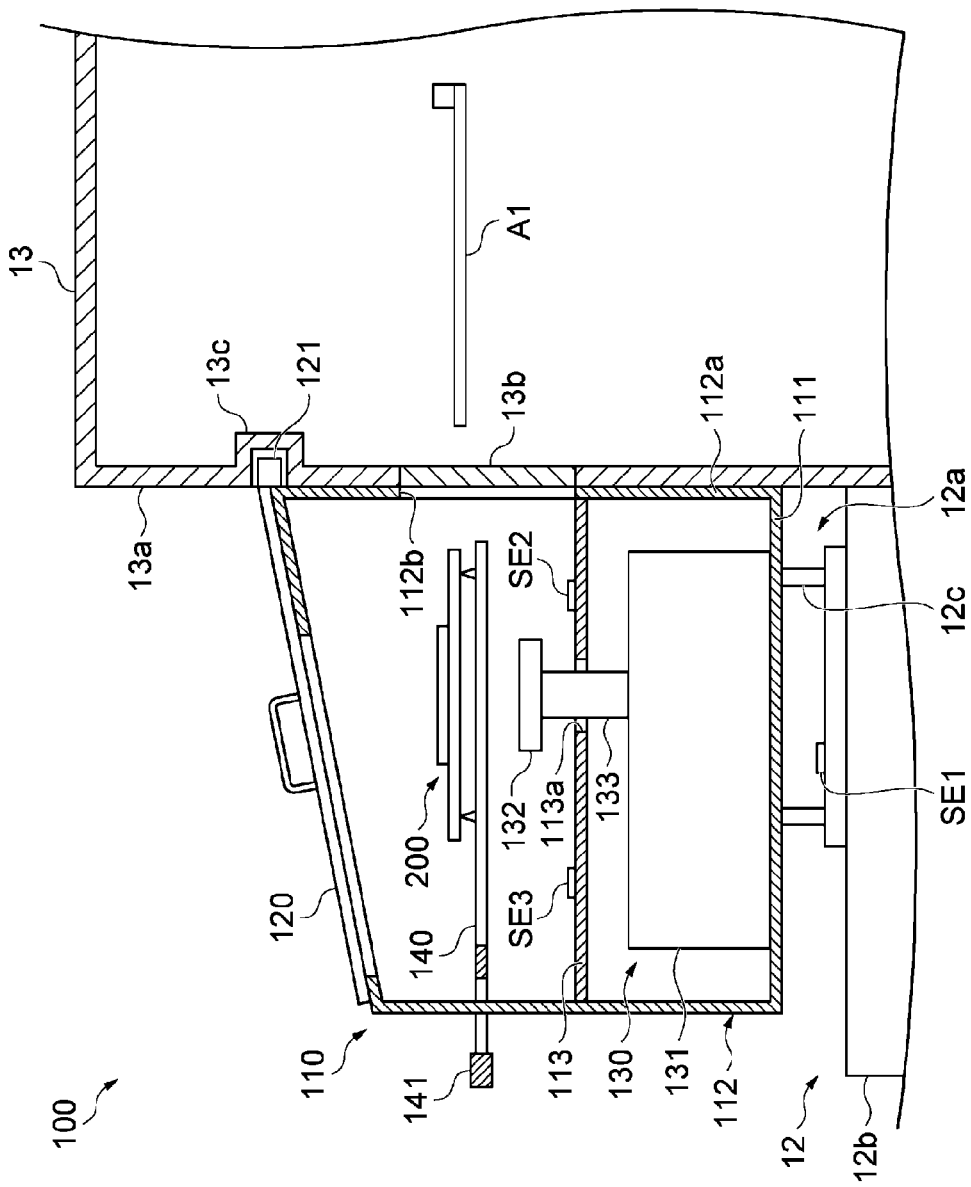
FIG. 13 is a diagram for explaining an example of the procedure for measuring the ejection amount of the processing liquid.

Subsequently, as illustrated in FIG. 13, the placement portion 12*a* is moved toward the sidewall 13*a* such that the placement portion 12*a* is located at the first position close to the carry-in/out port 13 (see step S13 in FIG. 17). As a result, the sidewall portion 112*a* approaches or comes into contact with the sidewall 13*a* such that the opening 112*b* faces the opening/closing door 13*b*. In addition, the engaged portion 121 of the opening/closing door 120 is engaged with the engaging portion 13*c* of the sidewall 13*a*. As a result, the closed state of the opening/closing door 120 is maintained.

Subsequently, as illustrated in FIG. 14, for example, the operator moves the transfer arm 140 downward by operating the grip part 141. In this process, the measuring jig 200 supported by the transfer arm 140 is delivered to the weighing pan 132. When the sensor SE3 detects that the transfer arm 140 reaches the vicinity of the partition wall 113, the weight of the measuring jig 200 is measured by the electronic balance 130 (see step S14 in FIG. 17). The measured data (jig weight data) is stored in the storage part M2, and the process proceeds to the next step. In addition, in order to suppress disturbance acting on the electronic balance 130, the controller Ctr may close the opening/closing door 13*b* during the measuring process by the electronic balance 130.

Subsequently, as illustrated in FIG. 15, the controller Ctr instructs the opening/closing door 13*b* to open the opening/closing door 13*b*. As a result, the interior of the measuring unit 100 and the interior of the carry-in/out part 13 communicate with each other through the opening 112*b*. thereafter, the controller Ctr instructs the transfer arms A1 and A12 to receive the measuring jig 200 placed on the weighing pan 132 by the transfer arm A1 and to transfer the measuring jig 200 to the liquid processing unit U21 by the transfer arms A1 and A12 (see step S15 in FIG. 17). When the measuring jig 200 is transferred to the liquid processing unit U21, the measuring jig 200 is placed on the rotation holder 20 by the transfer arm A12.

Figure 16A:
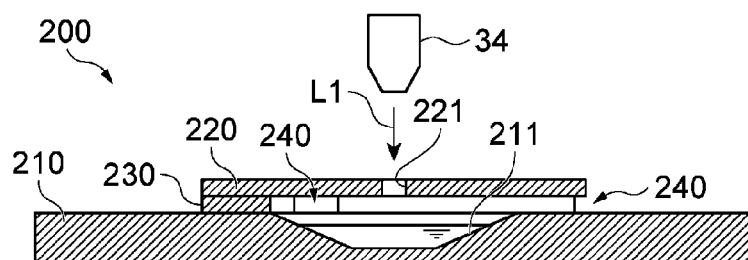
FIGS. 16A, 16B, and 16C are diagrams for explaining an example of the procedure for measuring the ejection amount of the processing liquid.

Subsequently, as illustrated in FIG. 16A, the controller Ctr instructs the liquid supplier 30 to position the nozzle 34 above the through-hole 221 such that the tip end of the nozzle 34 faces the through-hole 221. Thereafter, the controller Ctr instructs the liquid supplier 30 to supply the processing liquid L1 from the nozzle 34 toward the internal space of the measuring jig 200 through the through-hole 221. As a result, a predetermined amount of the processing liquid L1 is stored in the recess 211 in the base member 210 (see step S16 in FIG. 17).

Subsequently, the controller Ctr instructs the transfer arms A1 and A12 to receive the measuring jig 200 placed on the rotation holder 20 by the transfer arm A12 and to transfer the measuring jig 200 by the transfer arms A1 and A12 to the measuring unit 100 (see step S17 in FIG. 17). When the measuring jig 200 is transferred to the measuring unit 100, the measuring jig 200 is placed on the weighing pan 132 by the transfer arm A1. As a result, in the electronic balance 130, the total weight of the weight of the processing liquid L1 stored in the recess 211 in step S16 and the weight of the measuring jig 200 is measured (see step S18 in FIG. 17). The measured data (total weight data) is stored in the storage part M2. As in step S14, the controller Ctr may close the opening/closing door 13*b* during the measuring process by the electronic balance 130.

Subsequently, the processing part M3 calculates the ejection amount of the processing liquid L1 using the jig weight data and the total weight data stored in the storage part M2 (see step S19 in FIG. 17). For example, the processing part M3 may calculate the volume of the processing liquid L1 based on the difference value between the total weight data and the jig weight data, the temperature and the density of the processing liquid L1, and the like.

Subsequently, the processing part M3 corrects a supply condition of the processing liquid L1 (see step S20 in FIG. 17). For example, the processing part M3 may correct the supply condition of the processing liquid L1 in the liquid supplier 30 based on the difference between the ejection amount of the processing liquid L1 calculated in step S20 and the target value of the ejection amount. The processing part M3 may determine whether or not the difference falls within a predetermined range, and when the result of the determination is that the difference is outside the predetermined range, the processing part M3 may execute a correction process.

When the calculated ejection amount is larger than the target value, the processing part M3 may adjust the setting of the pump 32 to reduce the ejection pressure of the pump 32 or may adjust the setting of the valve 33 to reduce the opening degree of the valve 33. The processes of steps S19 and S20 may be executed after step S18, and may be executed after, for example, steps S21 and S22 to be described later.

Subsequently, the controller Ctr instructs the transfer arms A1 and A12 to receive the measuring jig 200 placed on the weighing pan 132 by the transfer arm A1 and to transfer the measuring jig 200 to the liquid processing unit U21 by the transfer arms A1 and A12 (see step S21 in FIG. 17). When the measuring jig 200 is transferred to the liquid processing unit U21, the measuring jig 200 is placed on the rotation holder 20 by the transfer arm A12.

Subsequently, the controller Ctr instructs the rotation holder 20 and the liquid supplier 40 to supply the cleaning liquid L2 from the nozzle 44 to the measuring jig 200 while rotating the measuring jig 200 held by the rotation holder 20 (see step S22 in FIG. 17).

Figure 16B:
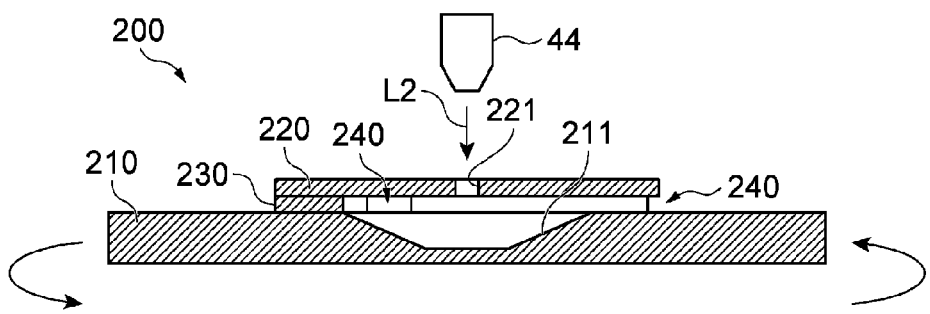

At this time, first, as illustrated in FIG. 16B, the controller Ctr instructs the liquid supplier 40 to position the nozzle 44 above the through-hole 221 such that the tip end of the nozzle 44 faces the through-hole 221. Thereafter, the controller Ctr instructs the rotation holder 20 and the liquid supplier 40 to rotate the measuring jig 200 held by the rotation holder 20 and to supply the cleaning liquid from the nozzle 44 toward the internal space of the measuring jig 200 through the through-hole 221. As a result, the processing liquid L1 stored in the recess 211 is dissolved by the cleaning liquid L2 and discharged from the drainage port 240 by virtue of a centrifugal force.

Figure 16C:
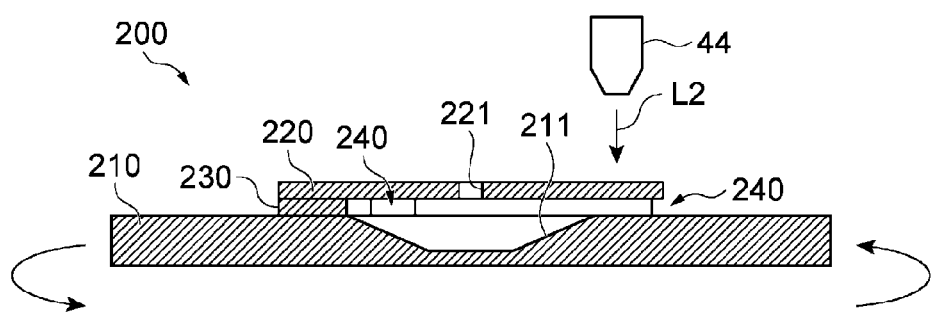

Subsequently, as illustrated in FIG. 16C, the controller Ctr instructs the liquid supplier 40 to position the nozzle 44 above the through-hole 221 such that the tip end of the nozzle 44 faces the top surface of the lid member 220 (the region that does not overlap the through-hole 221 when viewed from above). Thereafter, the controller Ctr instructs the rotation holder 20 and the liquid supplier 40 to supply the cleaning liquid from the nozzle 44 toward the top surface of the lid member 220 while rotating the measuring jig 200 held by the rotation holder 20. As a result, the cleaning liquid L2 is supplied to the stepped portion between the outer peripheral edge of the lid member 220 and the base member 210, and the cleaning liquid L2 is shaken off from the measuring jig 200 by virtue of a centrifugal force.

Consequently, the process of measuring the ejection amount of the processing liquid L1 and the process of cleaning the measuring jig 200 are completed. The cleaned measuring jig 200 may be transferred to the measuring unit 100 again for the next measuring process, and the processes after step S14 and subsequent steps may be executed again.

[Action]

According to the above example, the transfer of the measuring jig 200, the ejection of the processing liquid L1 to the measuring jig 200, and the measurement of the ejection amount is performed without the intervention of the operator. That is, only installing by the operator the measuring jig 200 in the measuring unit 100, the measurement of the ejection amount of the processing liquid L1 is completed without touching by the operator the measuring jig 200 to which the processing liquid L1 has been ejected. Therefore, it is possible to safely measure the ejection amount.

According to the above example, the data measured by the electronic balance 130 is transmitted to and processed by the controller Ctr. Therefore, it becomes possible to measure the ejection amount of the processing liquid L1 more accurately compared with the case in which the operator visually reads a measured value. When the controller Ctr receives data from the electronic balance 130, the controller Ctr may acquire an average value within a predetermined period as the measured value, may acquire a median value within a predetermined period as the measured value, or may acquire the most frequent value within a predetermined period as the measured value.

According to the above example, only when the operator places the measuring unit 100 on the placement stage 12b, which is easiest to access in the coating and developing apparatus 3, and disposes the measuring jig 200 on the measuring unit 100, the measurement of the ejection amount of the processing liquid L1 is completed. Therefore, it is not necessary to install the measuring unit 100, which is used only when adjusting the coating and developing apparatus 3, in the coating and developing apparatus 3. Accordingly, the ejection amount measuring operation is facilitated and simplified. As a result, the ejection amount of the processing liquid L1 used for processing the substrate W can be easily and simply measured. Since the placement portion 12a for the carrier 11 for accommodating the substrate W is used as a place for disposing the measuring unit 100, it is not necessary to newly provide a stage or the like for the measuring unit 100 in the coating and developing apparatus 3. Therefore, it becomes possible to suppress the complication and cost increase of the coating and developing apparatus 3.

According to the above example, the ejection amount of the processing liquid L1 can be calculated based on a difference value between total weight data and jig weight data. In this case, it is possible to simply and quickly obtain the ejection amount of the processing liquid L1 without requiring a complicated arithmetic process or the like.

According to the above example, the processing liquid L1 is supplied to the internal space of the measuring jig 200. Therefore, when the processing liquid L1 is volatile, the volatilization of the processing liquid L1 until the ejection amount is measured after the processing liquid L1 is ejected is suppressed. Moreover, the processing liquid L1 is supplied to the measuring jig 200 to which the base member 210, the lid member 220, and the plurality of wall members 230 are pre-assembled, through the through-hole 221. Therefore, the volatilization of the processing liquid L1 is further suppressed compared with the case in which the lid member 220 is provided to cover the base member 210 after the processing liquid L1 is supplied to the base member 210. Therefore, the ejection amount of the processing liquid L1 can be measured with extremely high accuracy.

According to the above example, the measuring jig 200 to which the processing liquid L1 has been ejected into is also cleaned in the coating and developing apparatus 3 without the intervention of an operator. Therefore, it is possible to further facilitate and simplify the operation of measuring an ejection amount.

According to the above example, the internal space of the measuring jig 200 is cleaned by the cleaning liquid L2 supplied through the through-hole 221 and then the exterior of the measuring jig 200 is cleaned by the cleaning liquid supplied to the lid member 220. Therefore, most or all of the processing liquid L1 is removed from the measuring jig 200. Therefore, when the ejection amount of the processing liquid L1 is measured again using the measuring jig 200, the ejection amount can be measured with extremely high accuracy.

According to the above example, the base member 210 includes the recess 21 formed to have a diameter that is reduced downward, and the plurality of wall members 230 are arranged to have an annular shape as a whole to surround the recess 211 and the through-hole 221. Therefore, the processing liquid L1 supplied to the measuring jig 200 is stored in the recess 211. Therefore, since the surface area of the processing liquid L1 exposed to the atmosphere becomes small, the volatilization of the processing liquid L1 is further suppressed. Since the diameter of the recess 211 is reduced toward the bottom, the processing liquid L1 is easily discharged from the recess 211 by virtue of a centrifugal force when the processing liquid L1 is discharged (when cleaning is performed using the cleaning liquid L2).

According to the above example, the end portions 231 of the plurality of wall members 230 have a tapered shape. That is, no stepped portion is provided on the peripheral edges of the end portions 231. Therefore, the processing liquid L1 easily flows from the internal space of the measuring jig 200 toward the drainage port 240. Therefore, when the processing liquid L1 is discharged (when cleaning is performed with the cleaning liquid L2), the processing liquid L1 is easily discharged from the internal space by virtue of a centrifugal force.

According to the above example, since the electronic balance 130 is accommodated in the housing 110, the electronic balance 130 is not easily affected by disturbance (e.g., wind, vibration, or the like). Therefore, the weight of the measuring jig 200 can be measured with extremely high accuracy by the electronic balance 130.

According to the above example, when the opening/closing door 120 is closed, the engaged portion 121 of the opening/closing door 120 and the engaging portion 13c of the sidewall 13a are engaged with each other, and thus the opening/closing door 120 is physically restrained with respect to the sidewall 13a. That is, the opening of the opening/closing door 120 is restricted. Therefore, it is possible to prevent the operator from accidentally opening the opening/closing door 120 during the measurement of the ejection amount of the processing liquid L1 using the measuring unit 100 and the measuring jig 200. Therefore, since the coating and developing apparatus 3 has a fail-safe structure, it is possible to reduce the risk that an operator comes into contact with the processing liquid L1.

According to the above example, the internal space of the housing 110 is vertically partitioned by the partition wall 113. That is, the upper space in which the processing liquid can be scattered and the lower space in which the main body 131, which is an electronic device, is present, are separated by the partition wall 113. Therefore, the electronic balance 130 can be protected from the processing liquid L1.

According to the above example, since the measuring jig 200 is disposed on the weighing pan 132 via the delivery arm 140, the misalignment of the measuring jig 200 with respect to the weighing pan 132 is suppressed. Therefore, unexpected fluctuation of the measured values due to the misalignment is suppressed. Therefore, the ejection amount of the processing liquid L1 can be measured with extremely high accuracy.

According to the above example, the supply condition of the processing liquid L1 in the liquid supplier 30 can be corrected based on the difference between the ejection amount of the processing liquid L1 calculated in step S20 and the target value of the ejection amount. In this case, the supply condition is automatically corrected by the controller Ctr such that the ejection amount of the processing liquid L1 in the liquid supplier 30 falls within a predetermined range. Therefore, the ejection amount of the processing liquid l1 can be adjusted quickly and highly accurately.

[Modification]

It shall be understood that the disclosure in this specification is exemplary in all respects and is not restrictive. Various omissions, substitutions, changes, or the like may be made to the above-described examples without departing from the scope of the claims and the gist thereof.

(1) In the above example, the stepped portion is formed between the outer peripheral edge of the lid member 220 and the base member 210, but the measuring jig 200 may not have the stepped portion. For example, the outer shape of the base member 210 and the outer shape of the lid member 220 may be substantially the same.

Figure 18:
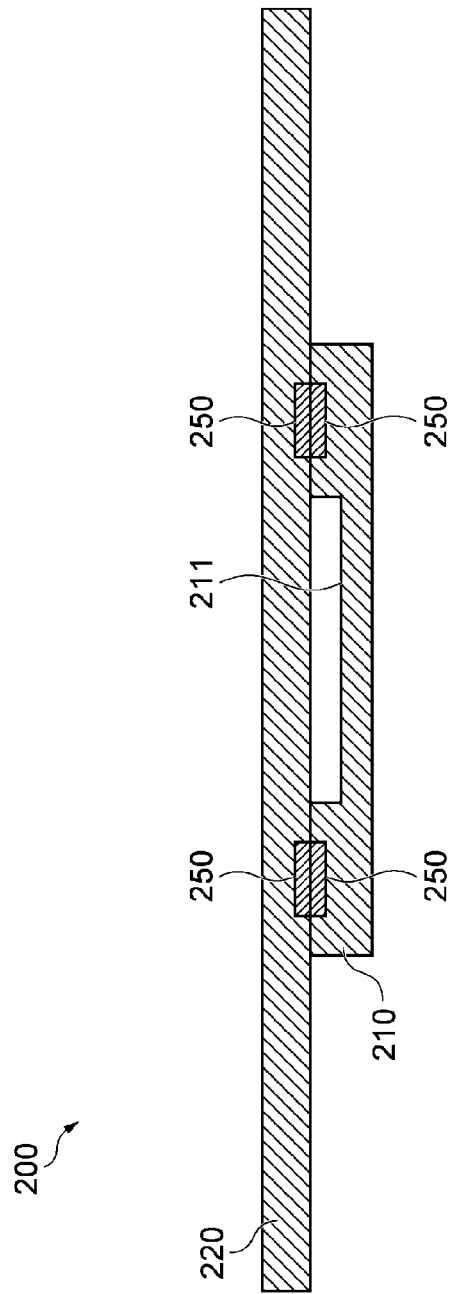
FIG. 18 is a cross-sectional view illustrating another example of a measuring jig.

(2) As illustrated in FIG. 18, the measuring jig 200 may not include the plurality of wall members 230, and the lid member 220 may be configured to be detachable with respect to the base member by magnets 250 that are embedded in the base member 210 and the lid member 220, respectively. In the embodiment illustrated in FIG. 18, the processing liquid L1 or the cleaning liquid L2 may be supplied to the recess 211 in the state in which the lid member 220 is removed from the base member 210. After the processing liquid L1 is supplied to the recess 211, the measuring jig 200 may be transferred in the state in which the lid member 220 is provided to the base member 210 in order to suppress the volatilization of the processing liquid L1.

Figure 19A:
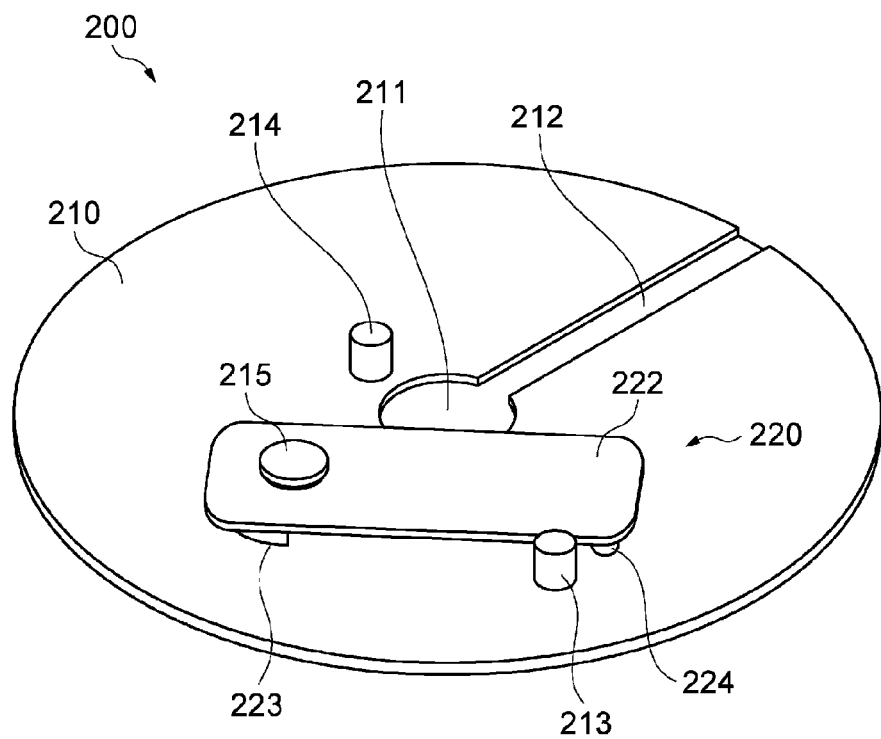
FIG. 19A is a perspective view of another example of the measuring jig when viewed from above.
Figure 19B:
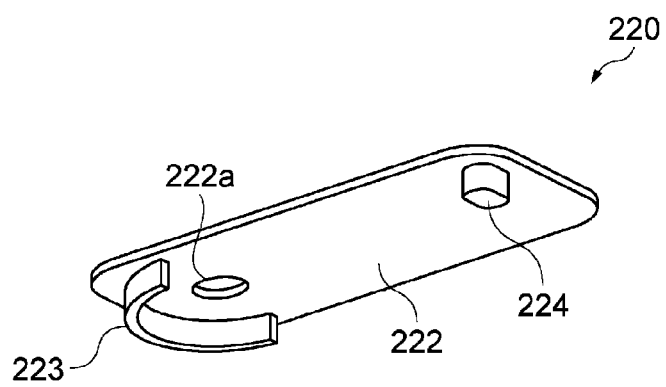
FIG. 19B is a perspective view of a lid member of the measuring jig of FIG. 19A when viewed from below.

(3) As illustrated in FIG. 19, the measuring jig 200 may not include the plurality of wall members 230, and the lid member 220 may be provided on the base member 210 to slide along the surface of the base member 210. In the embodiment illustrated in FIG. 19, a groove 212, stoppers 213 and 214, and a rotating shaft 215 are provided on the surface of the base member 210. The groove 212 extends linearly to connect the recess 211 located in the central portion of the base member 210 to the outer peripheral edge of the base member 210.

The stoppers 213 and 214 and the rotation shaft 215 each have, for example, a columnar shape and protrude upward from the surface of the base member 210. The stoppers 213 and 214 are disposed to face each other with the recess 211 interposed therebetween. The rotation shaft 215 is disposed on the side opposite to the groove 212 with respect to the recess 211.

The lid member 220 includes a cover part 222, a ridge 223, and a protrusion 224. The cover part 222 is, for example, a plate-shaped body having a rectangular shape, and is configured to cover the recess 211. A through-hole 222a through which the rotation shaft 215 is inserted is provided at one end of the cover part 222. Therefore, the lid member 220 is provided on the base member 210 to rotate around the rotation shaft 215 along the surface of the base member 210. Specifically, the lid member 220 is rotatable and movable between an open position and a covering position. The open position is a position at which one side edge of the cover part 222 is in contact with the stopper 213 and the cover part 222 does not cover the recess 211 when viewed from above. The covering position is a position at which the other side edge of the cover part 222 is in contact with the stopper 214 and the cover part 222 covers the recess 211. The open position and the covering position are automatically switched depending on whether the base member 210 rotates forward or reversely.

The ridge 223 is provided in one end portion of the cover part 222. Specifically, the ridge 223 protrudes downward (toward the base member 210) from the bottom surface of the cover part 222 (the surface facing the base member 210). The ridge 223 has an arc shape that extends to partially surround the through-hole 222a when viewed from above. Therefore, when the lid member 220 rotates, a resistance force generated between the ridge 223 and the base member 210 is suppressed, and the lid member 220 can rotate smoothly with respect to the base member 210. In addition, the ridge 223 may be provided to extend along the entire peripheral edge of the cover part 222. In this case, when the lid member 220 is located at the covering position, the volatilization of the processing liquid L1 supplied to the recess 211 can be effectively suppressed.

The protrusion 224 is provided in the other end portion of the cover part 222. The protrusion 224 protrudes downward (toward the base member 210) from the bottom surface of the cover part 222 (the surface facing the base member 210).

The protrusion 224 functions as a spacer for maintaining a separation distance between the base member 210 and the cover part 222.

(4) When supplying the cleaning liquid L2 to the measuring jig 200, it is not necessary to execute the process of supplying the cleaning liquid L2 to the top surface of the lid member 220 (the region that does not overlap the through-hole 221 when viewed from above).

(5) The technique according to the present disclosure may also be applied when measuring the ejection amount of the processing liquid L1 other than a resist liquid. Examples of the processing liquid L1 other than the resist liquid include a cleaning liquid (IPA and the like) used, for example, when cleaning the substrate W.

OTHER EXAMPLES

Example 1

In an example, a substrate processing system includes: a placement stage including a placement portion configured to place an accommodation container configured to accommodate a substrate; a measuring unit configured to be removable from the placement portion and further configured to measure a weight of an object to be measured; a measuring jig used for measuring a processing liquid; a liquid processing unit including a supplier configured to supply the processing liquid to the substrate or the measuring jig; a transfer mechanism configured to transfer the substrate or the measuring jig between the measuring unit and the liquid processing unit; and a controller. The controller is configured to execute: a first process of controlling the transfer mechanism to transfer the measuring jig in the measuring unit from the measuring unit to the liquid processing unit; a second process of controlling the liquid processing unit to eject the processing liquid from the supplier to the measuring jig after the first process; a third process of controlling the transfer mechanism to transfer the measuring jig from the liquid processing unit to the measuring unit after the second process; and a fourth process of calculating an ejection amount of the processing liquid based on a measurement value in the measuring unit after the third process. In this case, in the substrate processing system, the transfer of the measuring jig, the ejection of the processing liquid to the measuring jig, and the measurement of the ejection amount is performed without the intervention of an operator. That is, when the operator simply places the measuring unit on the placement stage that is easiest to access in the substrate processing system and disposes the measuring jig on the measuring unit, the measurement of the ejection amount of the processing liquid is completed. Therefore, it is not necessary to install a measuring unit, which is used only when adjusting the substrate processing system, in the substrate processing system. Accordingly, the ejection amount measuring operation is facilitated and simplified. As a result, it becomes possible to easily and simply measure the ejection amount of the processing liquid used for processing the substrate. In addition, since the placement portion of the accommodation container for accommodating the substrate is used as a place for placing the measuring unit, it is not necessary to newly provide a stage or the like for the measuring unit in the substrate processing system. Therefore, it is possible to suppress the complication and cost increase of the substrate processing system.

Example 2

In the system of Example 1, in the fourth process, the ejection amount of the processing liquid may be calculated based on the difference between the total weight of the processing liquid ejected in the second process along with the measuring jig and the weight of the measuring jig measured in advance in the measuring unit. In this case, it is possible to simply and quickly obtain the ejection amount of the processing liquid without requiring a complicated arithmetic process or the like.

Example 3

In the system of Example 1 or 2, the supplier may be configured to supply the processing liquid or the cleaning liquid to the substrate or the measuring jig, and the controller may be configured to further execute: a fifth process of controlling the transfer mechanism to transfer the measuring jig from the measuring unit to the liquid processing unit after the fourth process; and a sixth process of controlling the liquid processing unit to eject the cleaning liquid from the supplier to the measuring jig after the fifth process. In this case, the cleaning of the measuring jig to which the processing liquid is ejected is also performed in the substrate processing system without the intervention of an operator. Therefore, it becomes possible to further facilitate and simplify the ejection amount measuring operation.

Example 4

In the system of any one of Examples 1 to 3, the measuring jig may include: a base member having a size equal to that of the substrate; a lid member provided with a through-hole and placed on the base member; and a plurality of wall members disposed between the base member and the lid member to join the base member and the lid member, wherein, when viewed from a direction in which the base member and the lid member are arranged, the plurality of wall members may be arranged to form an annular shape as a whole to surround the through-hole and may be separated from each other, and the controller may be configured to control the liquid processing unit to eject the processing liquid to the base member through the through-hole in the second process. In this case, the processing liquid is ejected into the internal space of the measuring jig surrounded by the lid member, the base member, and the plurality of wall members. Therefore, when the processing liquid is volatile, the volatilization of the processing liquid is suppressed until the ejection amount is measured after the processing liquid is ejected. In this case, the processing liquid is supplied to the measuring jig to which the lid member, the base member, and the plurality of wall members are pre-assembled, through the through-hole. Therefore, the volatilization of the processing liquid is further suppressed compared with a form in which the lid member is provided to cover the base member after the processing liquid is supplied to the base member. Accordingly, it is possible to measure the ejection amount of the processing liquid with extremely high accuracy.

Example 5

In the system of Example 3, the measuring jig may include: a base member having a size equal to that of the substrate; a lid member provided with a through-hole and placed on the base member; and a plurality of wall members disposed between the base member and the lid member to join the base member and the lid member, wherein, when viewed from a direction opposite to the base member and the lid member, the plurality of wall members may be arranged to form an annular shape as a whole to surround the through-hole and may be separated from each other, and the controller may be further configured to: control the liquid processing unit to eject the processing liquid to the base member through the through-hole in the second process; and control the liquid processing unit to eject the cleaning liquid to the top surface of the lid member after ejecting the cleaning liquid to the base member through the through-hole in the sixth process. In this case, the same effects as those in Example 4 are obtained. In addition, in this case, the internal space of the measuring jig is cleaned by the cleaning liquid supplied through the through-hole, and then the outside of the measuring jig is cleaned by the cleaning liquid supplied to the lid member. Therefore, most or all of the processing liquid is removed from the measuring jig. Accordingly, when the ejection amount of the processing liquid is measured again using the measuring jig, it becomes possible to measure the ejection amount with extremely high accuracy.

Example 6

In the system of Example 4 or 5, the base member may include a recess formed therein to have a diameter that is reduced toward a bottom thereof, and the plurality of wall members may be arranged to surround the recess. In this case, the processing liquid supplied to the measuring jig (base member) is stored in the recess. Therefore, the surface area of the processing liquid exposed to the atmosphere is reduced, and thus the volatilization of the processing liquid is further suppressed. In addition, since the diameter of the recess is reduced toward the bottom of the recess, the processing liquid is easily discharged from the recess by virtue of a centrifugal force when the processing liquid is discharged (e.g., during cleaning).

Example 7

In the system of any one of Examples 4 to 6, the plurality of wall members may include a first wall member and a second wall member which are adjacent to each other in a direction in which the plurality of wall members are arranged, an end portion of the first wall member facing the second wall member may have a tapered shape, the width of which becomes narrower toward the second wall member, and an end portion of the second wall member facing the first wall member may have a tapered shape, the width of which becomes narrower toward the first wall member. In this case, no stepped portion is provided on the peripheral edge of the end portion of each of the first and second wall members. Therefore, the processing liquid easily flows from the internal space of the measuring jig toward the gap between the adjacent wall members. Accordingly, when the processing liquid is discharged (e.g., during cleaning), the processing liquid is easily discharged from the internal space by virtue of a centrifugal force.

Example 8

In the system of any of Examples 1 to 7, the measuring unit may include an electronic balance including a main body and a weighing pan connected to the main body, and a housing configured to accommodate the electronic balance. In this case, since the electronic balance is accommodated in the housing, the electronic balance is not easily affected by disturbance (e.g., wind, vibration, or the like). Therefore, it becomes possible to measure the weight of the measuring jig with extremely high accuracy by the electronic balance.

Example 9

The system of Example 8 may further include an accommodation part configured to accommodate the liquid processing unit and the transfer mechanism, wherein the accommodation part may include a sidewall facing the placement stage, the housing may include an opening/closing door to move therethrough the measuring jig into and out of the housing, and the opening/closing door may include an engaged portion configured to be engageable with an engaging portion provided on the sidewall in a closed state. In this case, in the state in which the opening/closing door is closed, since the engaged portion of the opening/closing door is engaged with the engaging portion of the sidewall of the processing block, the opening/closing door is physically restrained with respect to the sidewall. That is, the opening of the opening/closing door is restricted. Therefore, the operator is prevented from accidentally opening the opening/closing door during the measurement of the ejection amount of the processing liquid using the measuring unit and the measuring jig. Accordingly, since the substrate processing system has a fail-safe structure, it is possible to reduce the risk that the operator comes into contact with the processing liquid.

Example 10

In the system of Example 8 or 9, the housing may include a partition wall that vertically partitions the interior of the housing, and the main body may be disposed in a space below the partition wall, and the weighing pan may be disposed in a space above the partition wall. In this case, the space in which the processing liquid can be scattered and the space in which the main body, which is an electronic device, exists are separated by the partition wall. Therefore, the electronic balance can be protected from the processing liquid.

Example 11

In the system of any one of Examples 8 to 10, the measuring unit may further include a delivery member configured to move in the housing to deliver the measuring jig to the weighing pan. In this case, since the measuring jig is disposed on the weighing pan via the delivery member, the misalignment of the measuring jig relative to the weighing pan is suppressed. Therefore, unexpected fluctuation in measured values due to the misalignment is suppressed. Accordingly, it is possible to measure the ejection amount of the processing liquid with extremely high accuracy.

Example 12

In the system of any one of Examples 1 to 11, the controller may be configured to further execute a seventh process of correcting a supply condition of the processing liquid in the supplier when a difference between a target value of the ejection amount of the processing liquid and the ejection amount of the processing liquid calculated in the fourth process is out of a predetermined range. In this case, the supply conditions (e.g., ejection pressure, ejection flow rate, or the like) are automatically corrected by the controller so that the ejection amount of the processing liquid in the supplier falls within the predetermined range. Therefore, the ejection amount of the processing liquid can be adjusted quickly with high accurately.

Example 13

As an example, a liquid amount measuring method may include: a first step of placing a measuring unit on a placement portion of a placement stage, wherein the measuring unit is configured to place thereon an accommodation container configured to accommodate a substrate; a second step of transferring the measuring jig in the measuring unit from the measuring unit to the liquid processing unit after the first step; a third step of supplying a processing liquid from the supplier of the liquid processing unit to the measuring jig after the second step; a fourth step of transferring the measuring jig from the liquid processing unit to the measuring unit and measuring weights of the measuring jig and the processing liquid in the measuring unit after the third step; and a fifth step of calculating an ejection amount of the processing liquid based on a measurement value in the measuring unit after the fourth step. In this case, the same effects as those of the system of Example 1 are obtained.

Example 14

The method of Example 13 may further include a sixth step of measuring the weight of the measuring jig in the measuring unit after the first step and before the second step, wherein the fifth step may include calculating the ejection amount of the processing liquid based on a difference between the weight measured in the fourth step and the weight measured in the sixth step. In this case, the same effects as those of the system of Example 2 are obtained.

Example 15

The method of Example 13 or 14 may further include: a seventh step of transferring the measuring jig from the measuring unit to the liquid processing unit after the fifth step; and an eighth step of supplying a cleaning liquid from the supplier to the measuring jig after the seventh step. In this case, the same effects as those of the system of Example 3 are obtained.

Example 16

In the method of any one of Examples 13 to 15, the measuring jig may include: a base member having a size equal to that of the substrate; a lid member provided with a through-hole and placed on the base member; and a plurality of wall members disposed between the base member and the lid member to join the base member and the lid member, wherein, when viewed from a direction in which the base member and the lid member are arranged, the plurality of wall members may be arranged to form an annular shape as a whole to surround the through-hole and may be separated from each other, and wherein the third step may include ejecting the processing liquid from the supplier to the base member through the through-hole. In this case, the same effects as those of the system of Example 4 are obtained.

Example 17

In the method of Example 15, the measuring jig may include: a base member having a size equal to that of the substrate; a lid member provided with a through-hole and placed on the base member; and a plurality of wall members disposed between the base member and the lid member to join the base member and the lid member, wherein, when viewed from a direction opposite to the base member and the lid member, the plurality of wall members may be arranged to form an annular shape as a whole to surround the through-hole and may be separated from each other, and wherein the third step may include ejecting the processing liquid from the supplier to the base member through the through-hole, and the eighth step may include ejecting the cleaning liquid to the top surface of the lid member from the supplier after ejecting the cleaning liquid from the supplier to the base member through the through-hole. In this case, the same effects as those of the system of Example 5 are obtained.

Example 18

The method of any one of Examples of 13 to 17 may further include a ninth step of correcting a supply condition of the processing liquid in the supplier when a difference between a target value of the ejection amount of the processing liquid and the ejection amount of the processing liquid calculated in the fifth process is out of a predetermined range. In this case, the same effects as those of the system of Example 12 are obtained.

Example 19

As an example, a computer-readable recording medium may store a program that causes the substrate processing system to execute the method of any one of Examples 13 to 18. In this case, the same effects as those of the system of Example 1 are obtained. In the present specification, the computer-readable recording medium may include a non-transitory computer recording medium (e.g., various main storage devices or auxiliary storage devices) or a propagation signal (a transitory computer recording medium) (e.g., a data signal that can be provided via a network).

According to the substrate processing system, the liquid amount measuring method, and the non-transitory computer-readable recording medium according to the present disclosure, it is possible to easily and simply measure the ejection amount of a processing liquid used for substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A liquid amount measuring method comprising:
 a first step of placing a measurement device on a carrier support of a placement stage, wherein the carrier support is configured to place thereon a carrier configured to accommodate a substrate;
 a second step of transferring a measuring jig in the measurement device from the measurement device to a liquid processing unit after the first step;
 a third step of supplying a processing liquid from a supplier having a nozzle of the liquid processing unit to the measuring jig after the second step to store the processing liquid in the measuring jig;

a fourth step of, after the third step, transferring the measuring jig from the liquid processing unit to the measurement device, measuring a weight of the measuring jig, in which the processing liquid is stored, in the measurement device, and storing the measured weight in a controller; and a fifth step of calculating an ejection amount of the processing liquid based on the weight stored in the controller after the fourth step, wherein the measuring jig comprises:
- a base member having a size equal to a size of the substrate;
- a lid member provided with a through-hole and placed on the base member; and
- a plurality of wall members disposed between the base member and the lid member to join the base member and the lid member, wherein, when viewed from a direction in which the base member and the lid member are arranged, the plurality of wall members are arranged to form an annular shape as a whole to surround the through-hole and are separated from each other, and wherein the third step includes ejecting the processing liquid from the supplier to the base member through the through-hole.

2. The liquid amount measuring method of claim 1, further comprising:

a sixth step of measuring the weight of the measuring jig in the measurement device after the first step and before the second step, wherein the fifth step includes calculating the ejection amount of the processing liquid based on a difference between the weight measured in the fourth step and the weight measured in the sixth step.

3. The liquid amount measuring method of claim 1, further comprising:

a seventh step of transferring the measuring jig from the measurement device to the liquid processing unit after the fifth step; and an eighth step of supplying a cleaning liquid from the supplier to the measuring jig after the seventh step.

4. The liquid amount measuring method of claim 3, wherein the eighth step includes ejecting the cleaning liquid from the supplier to a top surface of the lid member after ejecting the cleaning liquid from the supplier to the base member through the through-hole.

5. The liquid amount measuring method of claim 1, further comprising:

a ninth step of correcting a supply condition of the processing liquid in the supplier when a difference between a target value of the ejection amount of the processing liquid and the ejection amount of the processing liquid calculated in the fifth step is out of a predetermined range.

* * * * *